(12) United States Patent
Chen et al.

(10) Patent No.: US 11,877,425 B2
(45) Date of Patent: Jan. 16, 2024

(54) HEAT SPREADER WITH INTEGRATED FINS

(71) Applicant: GM Cruise Holdings LLC, San Francisco, CA (US)

(72) Inventors: Kaida Chen, San Jose, CA (US); Zoran Stefanoski, San Francisco, CA (US); Srinivasa Rao Damaraju, San Francisco, CA (US); Cathy Yoon, Scotts Valley, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 0 days.

(21) Appl. No.: 17/333,761

(22) Filed: May 28, 2021

(65) Prior Publication Data
US 2022/0386510 A1    Dec. 1, 2022

(51) Int. Cl.
*H05K 7/20* (2006.01)
*H05K 1/02* (2006.01)
(Continued)

(52) U.S. Cl.
CPC ....... *H05K 7/20509* (2013.01); *H05K 1/0203* (2013.01); *H05K 7/20336* (2013.01);
(Continued)

(58) Field of Classification Search
CPC ........... H05K 7/20254; H05K 7/20772; H05K 7/20927; H05K 7/20336; H05K 7/20872;
(Continued)

(56) References Cited

U.S. PATENT DOCUMENTS

| 7,344,384 B2 * | 3/2008 | Rubenstein | ......... H01L 23/4006 |
| | | | 257/E23.084 |
| 7,583,504 B2 * | 9/2009 | Aberg | ................. H01L 23/4338 |
| | | | 174/16.3 |

(Continued)

FOREIGN PATENT DOCUMENTS

| EP | 2672512 A2 | 12/2013 |
| WO | 2022250719 A1 | 12/2022 |

OTHER PUBLICATIONS

"International Search Report and Written Opinion for PCT Patent Application No. PCT/US2021/048400", dated Feb. 25, 2022, 14 pages.

*Primary Examiner* — Zachary Pape
(74) *Attorney, Agent, or Firm* — Calfee, Halter & Griswold LLP

(57) ABSTRACT

Various technologies described herein pertain to a heat spreader for an autonomous vehicle computing device. The heat spreader includes a top surface, a bottom surface, and a side surface. The top surface of the heat spreader is thermally conductive. The top surface of the heat spreader includes a section that is sized and shaped to align with a heat generating component (e.g., on a printed circuit board assembly). The top surface of the heat spreader is configured to receive heat from the heat generating component. The bottom surface of the heat spreader includes externally integrated fins. The heat spreader is configured to dissipate the heat from the heat generating component such that the heat from the heat generating component flows from the top surface to the externally integrated fins on the bottom surface.

20 Claims, 21 Drawing Sheets

(51) Int. Cl.
*H01L 23/473* (2006.01)
*H01L 23/40* (2006.01)

(52) U.S. Cl.
CPC ...... *H01L 23/473* (2013.01); *H01L 2023/405* (2013.01); *H05K 7/20254* (2013.01); *H05K 7/20872* (2013.01)

(58) Field of Classification Search
CPC . H05K 1/0203; H01L 23/473; H01L 23/3677; H01L 23/40–4006; H01L 2023/4018–4087
See application file for complete search history.

(56) References Cited

U.S. PATENT DOCUMENTS

| | | | |
|---|---|---|---|
| 9,196,564 B2* | 11/2015 | Gektin | H01L 23/4006 |
| 9,674,986 B2* | 6/2017 | Pope | H05K 7/205 |
| 10,638,646 B2* | 4/2020 | Guo | H05K 7/209 |
| 11,011,454 B2 | 5/2021 | Yoshihara et al. | |
| 2014/0376184 A1 | 12/2014 | Gohara | |
| 2015/0060023 A1* | 3/2015 | Herring | F28D 15/0266 29/890.032 |
| 2019/0304874 A1 | 10/2019 | Arai | |
| 2019/0368413 A1* | 12/2019 | Carter | H05K 7/20872 |

* cited by examiner

HEAT SPREADER WITH INTEGRATED FINS

BACKGROUND

An autonomous vehicle is a motorized vehicle that can operate without human conduction. An exemplary autonomous vehicle includes a plurality of sensor systems, such as but not limited to, a lidar sensor system, a camera sensor system, and a radar sensor system, amongst others. The autonomous vehicle can operate based upon sensor signals outputted by the sensor systems.

The autonomous vehicle can also include one or more autonomous vehicle computing devices. An autonomous vehicle computing device can control various vehicle functions. Examples of vehicle functions that can be controlled by the autonomous vehicle computing device include driving control (e.g., propulsion, steering, braking, etc.), localization of the autonomous vehicle (e.g., determining a local position of the autonomous vehicle), perception of objects nearby the autonomous vehicle (e.g., detecting, classifying, and predicting behavior of the objects nearby the autonomous vehicle), a combination thereof, and so forth. According to an illustration, sensor signals from a sensor system can be inputted to an autonomous vehicle computing device. Moreover, pursuant to another illustration, a sensor system can include an autonomous vehicle computing device.

An autonomous vehicle computing device oftentimes includes a printed circuit board assembly and a heat sink. Moreover, one or more heat generating components can be on the printed circuit board assembly. Heat produced by a heat generating component on the printed circuit board assembly typically flows to the heat sink. Various layers may be between the heat generating component and the heat sink. For instance, one or more thermal interface material layers, amongst other types of layers, may be between the heat generating component and the heat sink. Thus, to dissipate the heat generated by the heat generating component, the heat typically flows through the various layers between the heat generating component and the heat sink. However, thermal resistance of one or more of the layers between the heat generating component and the heat sink can detrimentally impact thermal performance of such a conventional autonomous vehicle computing device.

SUMMARY

The following is a brief summary of subject matter that is described in greater detail herein. This summary is not intended to be limiting as to the scope of the claims.

Described herein are various technologies that pertain to a heat spreader for an autonomous vehicle computing device. The heat spreader includes a top surface, a bottom surface, and a side surface. The side surface of the heat spreader includes a top edge and a bottom edge. The top edge of the side surface is physically coupled to the top surface, and the bottom edge of the side surface is physically coupled to the bottom surface. The top surface of the heat spreader is thermally conductive. Moreover, the top surface of the heat spreader can include a section that is sized and shaped to align with a heat generating component (e.g., the heat generating component can be on a printed circuit board assembly). Thus, the top surface of the heat spreader is configured to receive heat from the heat generating component (e.g., the heat generated by the heat generating component can flow to the top surface of the heat spreader). Further, the bottom surface of the heat spreader includes externally integrated fins. The heat spreader is configured to dissipate the heat from the heat generating component such that the heat from the heat generating component flows from the top surface to the externally integrated fins on the bottom surface.

According to various embodiments, the heat spreader can include heat pipes. The heat pipes can be at least partially within a housing of the heat spreader, where the housing is defined by the top surface, the bottom surface, and the side surface. According to other embodiments, the heat spreader can include a vapor chamber within the housing of the heat spreader defined by the top surface, the bottom surface, and the side surface. Yet, according to other embodiments, the heat spreader can be solid (e.g., the heat spreader can lack heat pipes, a vapor chamber, or other type of cavity within the housing defined by the top surface, the bottom surface, and the side surface). Examples of materials from which the heat spreader can be at least partially formed include pyrolytic graphite, copper, and aluminum. Further, the heat spreader can include a channel defined in the side surface around heat spreader, where the channel can be configured to receive a mechanical gasket; the mechanical gasket can be utilized to form a seal between the heat spreader and a heat sink (e.g., a coldplate).

The heat spreader can be included in an autonomous vehicle computing device in various embodiments. In addition to the heat spreader, the autonomous vehicle computing device can include a backplate, a printed circuit board assembly, and a coldplate. The printed circuit board assembly can include a heat generating component (e.g., the heat generating component can be on the printed circuit board assembly). The printed circuit board assembly can be between the backplate and the heat spreader, and the heat spreader can be between the printed circuit board assembly and the coldplate (e.g., the heat generating component can be between the printed circuit board assembly and the heat spreader). Moreover, the coldplate can have a cavity defined therein. The coldplate includes a top coldplate surface, where an opening is defined through the top coldplate surface of the coldplate to the cavity. When the autonomous vehicle computing device is assembled, the externally integrated fins on the bottom surface of the heat spreader can be positioned within the cavity in the coldplate. Moreover, a mechanical gasket (e.g., o-ring) positioned in the channel defined in the side surface around of the heat spreader can be between the side surface of the heat spreader and the top coldplate surface of the coldplate (e.g., the mechanical gasket can be utilized to form a seal between the heat spreader and the coldplate). A coolant can be within the cavity of the coldplate; thus, the externally integrated fins on the bottom surface of the heat spreader can be immersed within the coolant.

Inclusion of the heat spreader with the externally integrated fins on the bottom surface in an autonomous vehicle computing device enables removal of one or more layers of material oftentimes included in conventional autonomous vehicle computing devices between a heat generating component and a heat sink (e.g., a coldplate). For instance, the autonomous vehicle computing device with the heat spreader described herein need not include a thermal interface material layer between the heat spreader and the coldplate; such a thermal interface material layer is oftentimes included in conventional architectures. Moreover, the heat from the heat generating component need not flow through the top coldplate surface of the coldplate (e.g., since the externally integrated fins on the bottom surface of the heat spreader can be immersed in the coolant in the cavity within the coldplate). Thus, the heat spreader with the externally integrated fins can provide improved thermal performance for efficient cooling as compared to conventional autonomous vehicle computing devices.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
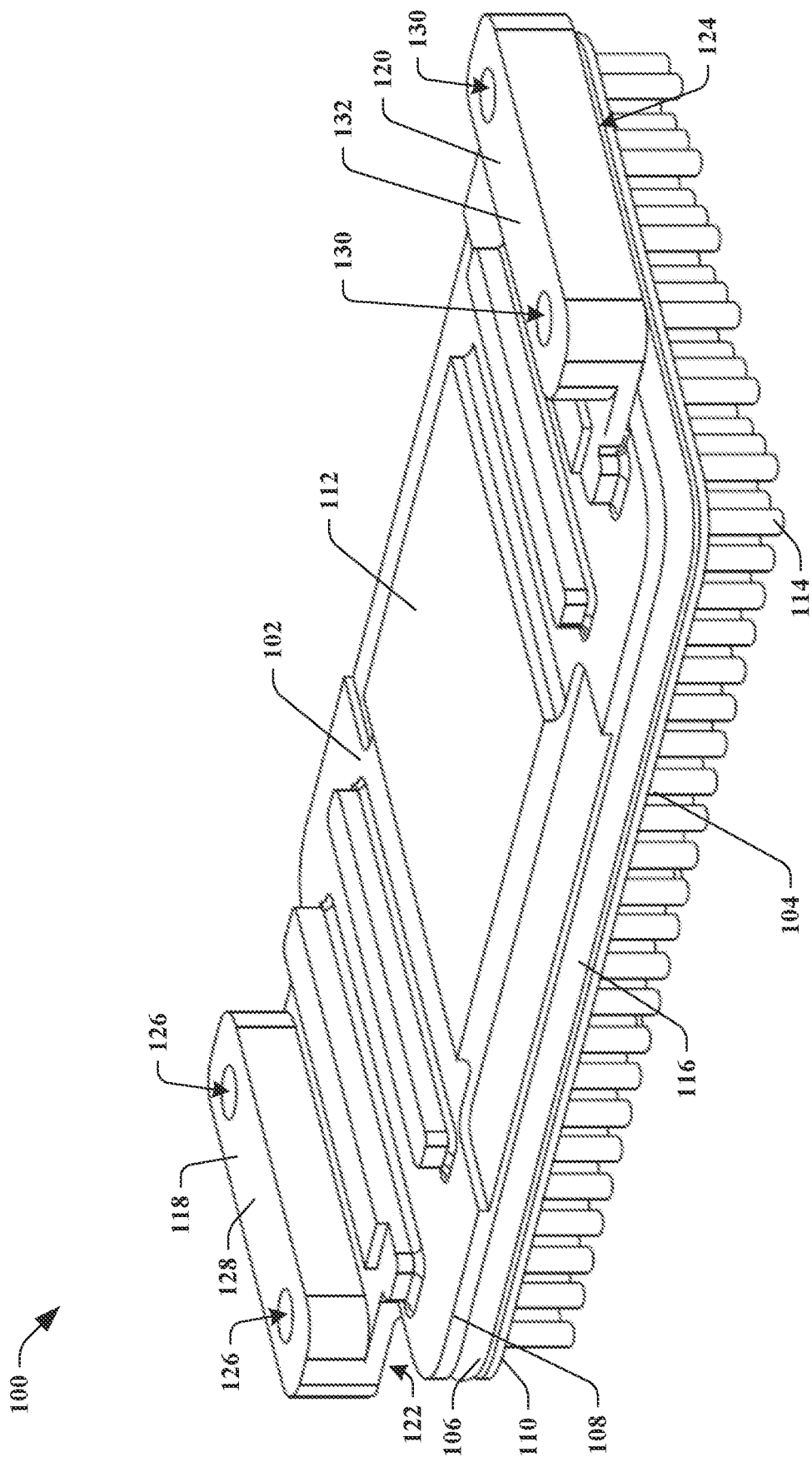
FIGS. 1-2 illustrate an exemplary heat spreader for an autonomous vehicle computing device.

Various technologies pertaining to a heat spreader with externally integrated fins for an autonomous vehicle computing device are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Further, as used herein, the term "exemplary" is intended to mean "serving as an illustration or example of something."

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

The terms "top" and "bottom" are used herein for identification purposes. It is contemplated that a heat spreader or an autonomous vehicle computing device can be oriented in substantially any manner. For instance, a top surface need not be above a bottom surface when an autonomous vehicle computing device is in an autonomous vehicle.

Figure 2:
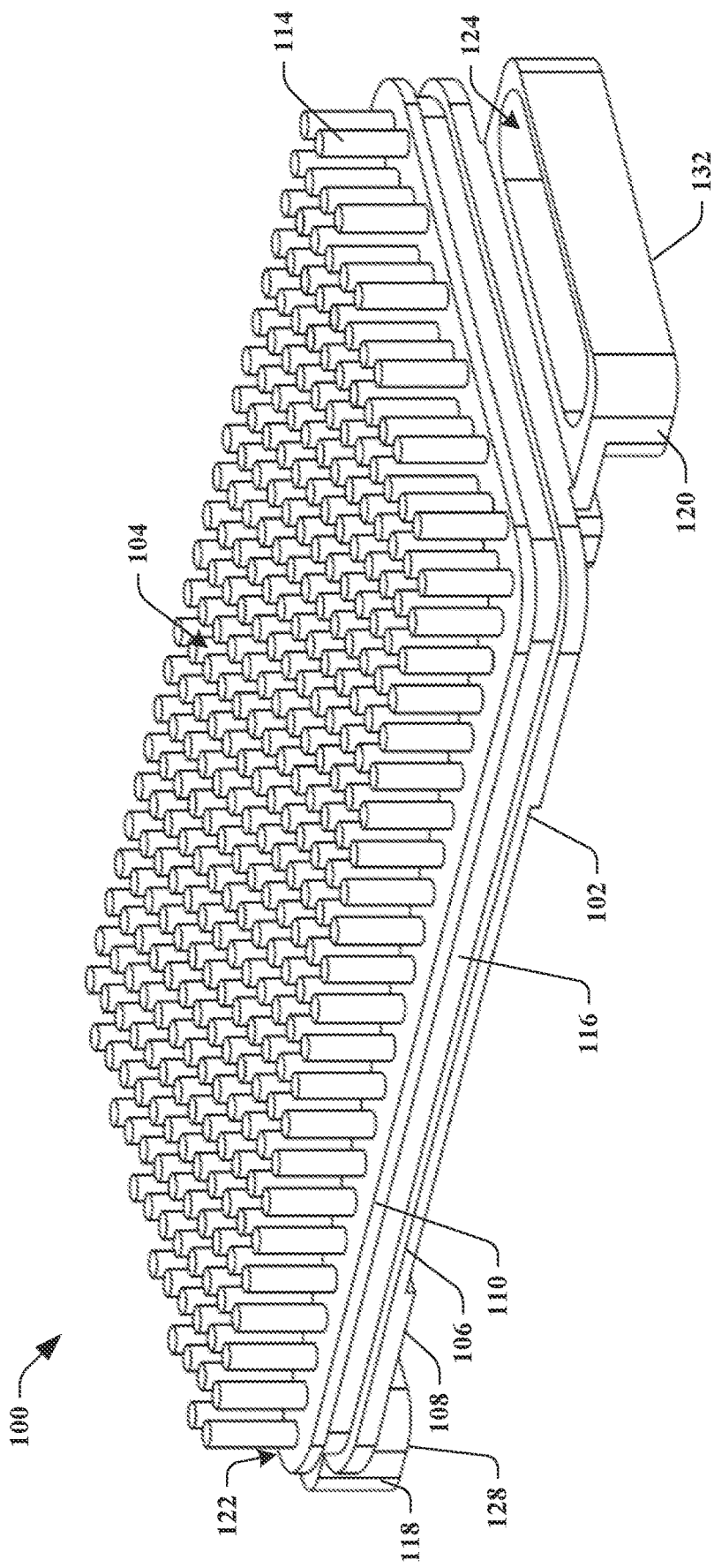

Referring now to the drawings, FIGS. 1-2 illustrate two views of an exemplary heat spreader 100 for an autonomous vehicle computing device. FIG. 1 depicts a view directed towards a top surface 102 of the heat spreader 100 and FIG. 2 depicts a view directed towards a bottom surface 104 of the heat spreader 100. FIGS. 1-2 are described below in combination.

The heat spreader 100 includes the top surface 102, the bottom surface 104, and a side surface 106. The side surface 106 includes a top edge 108 and a bottom edge 110. The top edge 108 of the side surface 106 is physically coupled to the top surface 102 (e.g., the top edge 108 and the top surface 102 are contiguous). Moreover, the bottom edge 110 of the side surface 106 is physically coupled to the bottom surface 104 (e.g., the bottom edge 110 and the bottom surface 104 are contiguous). The top surface 102, the bottom surface 104, and the side surface 106 form a housing of the heat spreader 100.

The top surface 102 is a thermally conductive surface. The top surface 102 can include various elements shaped and sized to correspond to one or more heat generating components. For instance, the top surface 102 include a section 112 sized and shaped to align with a heat generating component when included in an autonomous vehicle computing device. According to an illustration, the section 112 can be sized and shaped to align to a cross sectional area of the heat generating component (or a portion of the heat generating component from which heat flows), mitigate gaps between the heat generating component and the section 112, and provide sufficient clearance for other components. Moreover, the top surface 102 (e.g., the section 112) is configured to receive heat from the heat generating component (e.g., when in an assembled autonomous vehicle computing device that includes the heat spreader 100 and the heat generating component).

The bottom surface 104 includes externally integrated fins 114. The externally integrated fins 114 can be machined or forged onto the bottom surface 104 of the heat spreader 100 (which can reduce layers of thermal resistance and a number of parts in an autonomous vehicle computing device). The externally integrated fins 114 provide for convective cooling. Thus, the heat spreader 100 is configured to dissipate heat from a heat generating component such that heat flows from the top surface 102 (e.g., from the section 112) to the externally integrated fins 114 on the bottom surface 104. While many of the examples set forth herein depict the externally integrated fins 114 having a cylindrical shape (e.g., the externally integrated fins 114 have a circular cross section, the externally integrated fins 114 are pin fins), it is to be appreciated that any shape fin is intended to fall within the scope of the hereto appended claims (e.g., the externally integrated fins 114 can have a rectangular cross section, a half circular cross section, a polygonal cross section, a combination thereof, or substantially any other cross section). Moreover, the bottom surface 104 can include substantially any number of externally integrated fins 114, the externally integrated fins 114 can be positioned and/or oriented in substantially any manner with respect to each other, and the externally integrated fins 114 can be substantially any size. The externally integrated fins 114 allow for increasing a surface area of the heat spreader 100 (e.g., of the bottom surface 104, to enhance heat flow from the heat spreader 100 to a coolant when the externally integrated fins 114 are immersed in the coolant); for instance, due to the number of externally integrated fins 114 that can be immersed in a coolant, the surface area exposed to the coolant can be increased (compared to a surface lacking such fins), which can enhance thermal performance.

Further, a channel 116 can be defined in the side surface 106 around the heat spreader 100. The channel 116 is a groove around a perimeter of the heat spreader 100. The channel 116 is configured to receive a mechanical gasket (e.g., an o-ring). The mechanical gasket can be formed of elastomer and can be seated in the channel 116 and compressed during assembly; for instance, the mechanical gasket can be compressed between the heat spreader 100 (e.g., the side surface 106) and a coldplate when the heat spreader 100 and the coldplate are assembled together.

The heat spreader 100 can also include a mounting element 118 and a mounting element 120 (collectively referred to herein as mounting elements 118-120). The mounting elements 118-120 are depicted in the exemplary heat spreader 100 shown in FIGS. 1-2 as being physically coupled to the top surface 102 of the heat spreader 100. However, it is to be appreciated that the mounting elements 118-120 can additionally or alternatively be physically coupled to the side surface 106 and/or the bottom surface 104 of the heat spreader 100. In the embodiment of the heat spreader 100 shown in FIGS. 1-2, the mounting elements 118-120 enable the heat spreader 100 to be mounted to a backplate in an autonomous vehicle computing device.

In the exemplary heat spreader 100, the mounting elements 118-120 each include a respective pocket; more particularly, the mounting element 118 includes a pocket 122 and the mounting element 120 includes a pocket 124. An opening into the pocket 122 is defined on a bottom side of the mounting element 118, and an opening into the pocket 124 is defined on a bottom side of the mounting element 120. Although not shown in FIGS. 1-2, a leaf spring can be inserted into the pocket 122 of the mounting element 118, and another leaf spring can be inserted into the pocket 124 of the mounting element 120. The leaf springs can allow for substantially uniform compressive forces to be applied between the top surface 102 (e.g., the section 112) of the heat spreader 100 and a heat generating component. Moreover, mounting holes 126 are defined through a top surface 128 of the mounting element 118, and mounting holes 130 are defined through a top surface 132 of the mounting element 120. As shown in greater detail herein, fasteners (e.g., screws, bolts, etc.) can pass through the mounting holes 126 and the mounting holes 130.

According to various embodiments, the heat spreader 100 can be formed at least partially of pyrolytic graphite. According to another example, the heat spreader 100 can be formed at least partially of copper. Pursuant to yet another example, the heat spreader 100 can be formed at least partially of aluminum.

Figure 3:
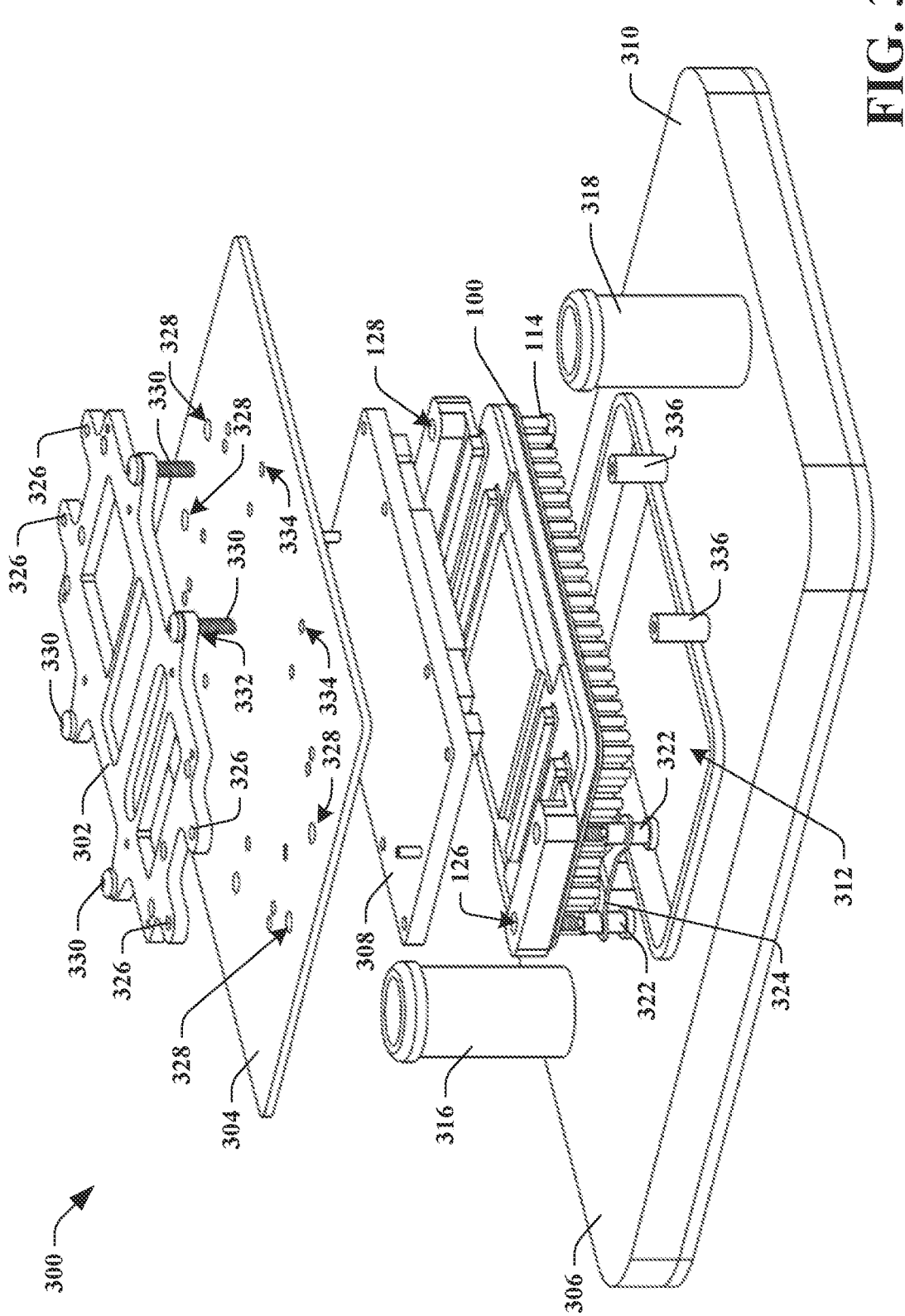
FIGS. 3-8 illustrate an exemplary autonomous vehicle computing device that includes the heat spreader of FIGS. 1-2.
Figure 4:
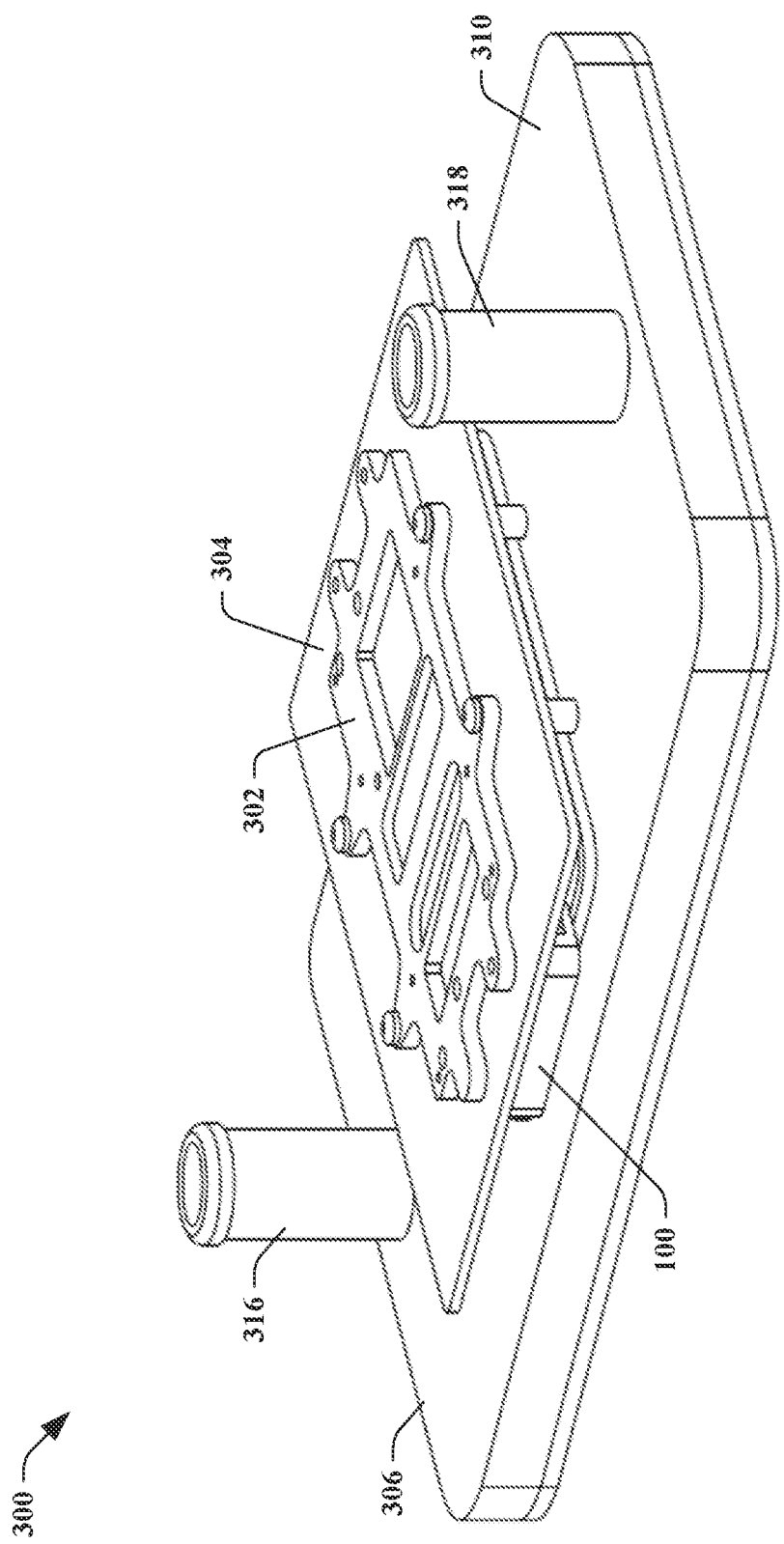
Figure 5:
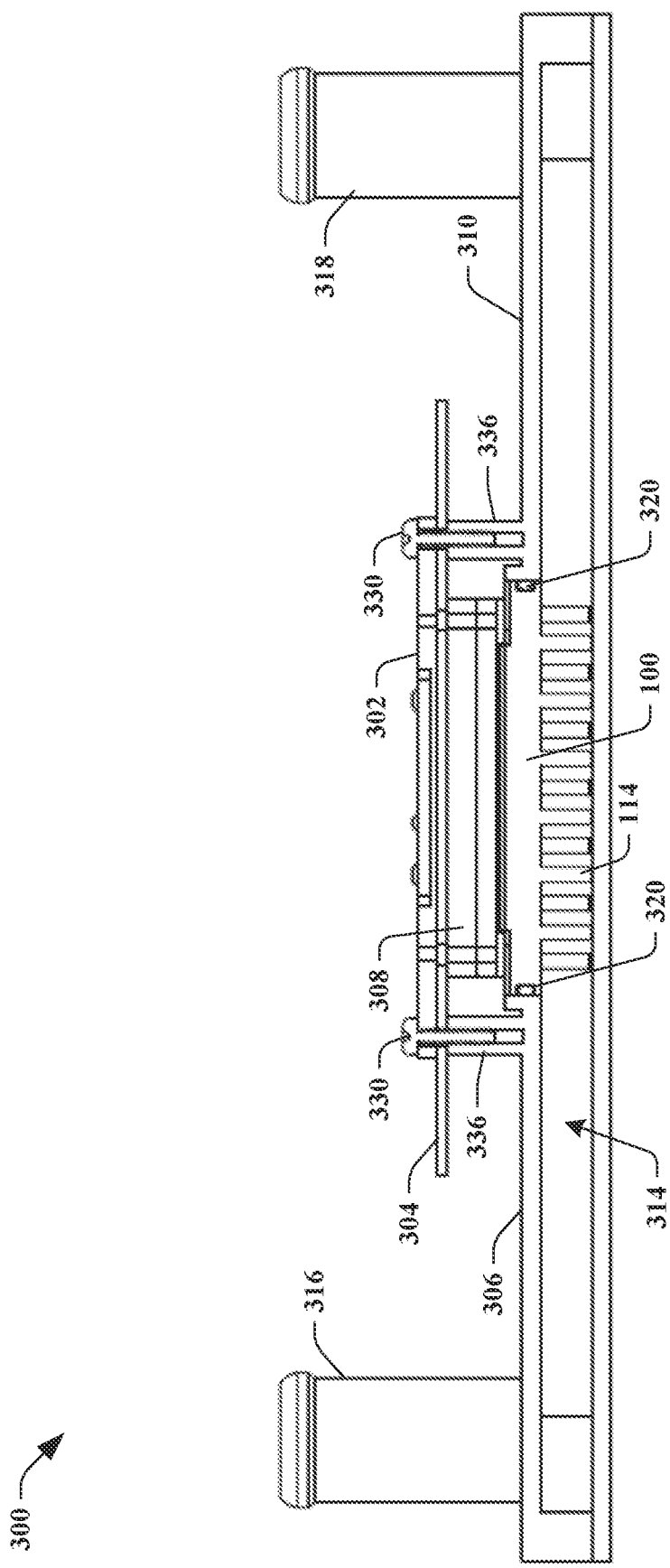
Figure 6:
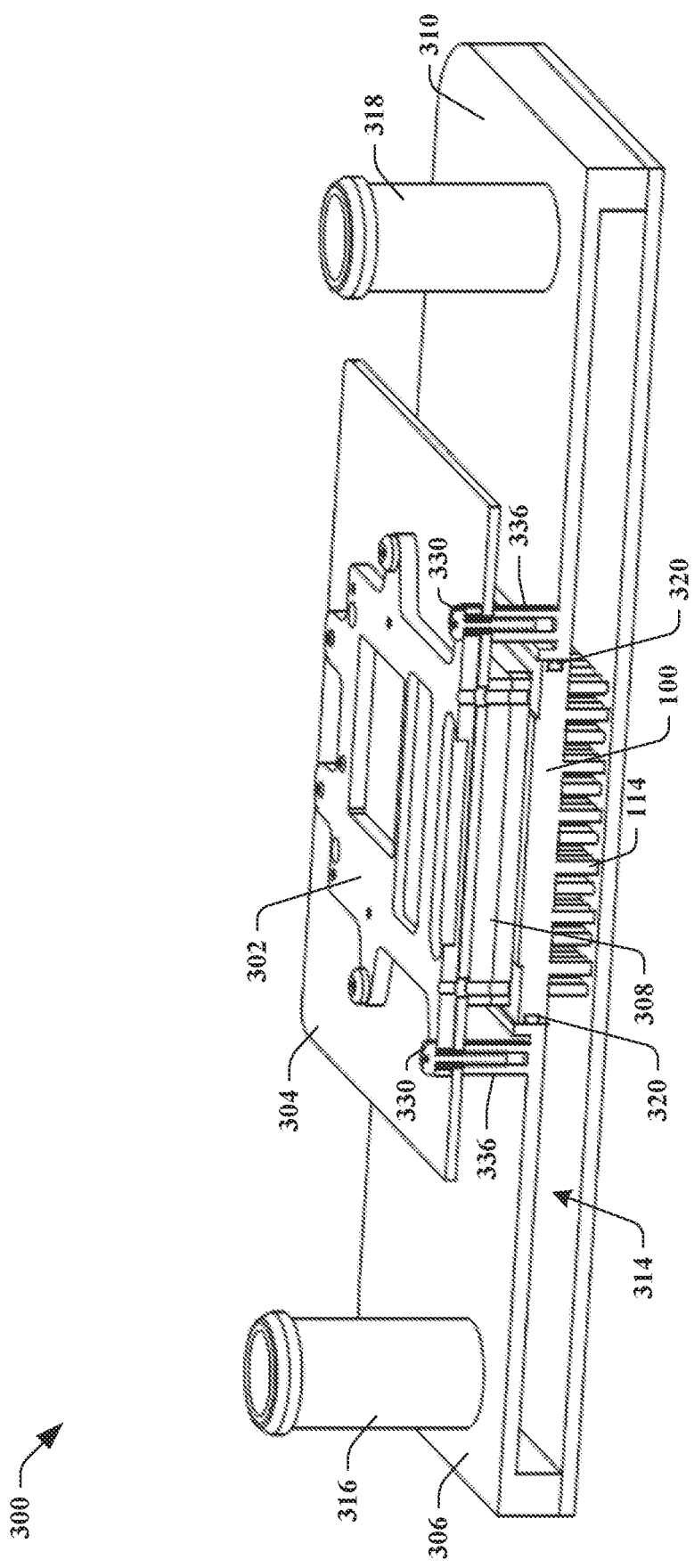
Figure 7:
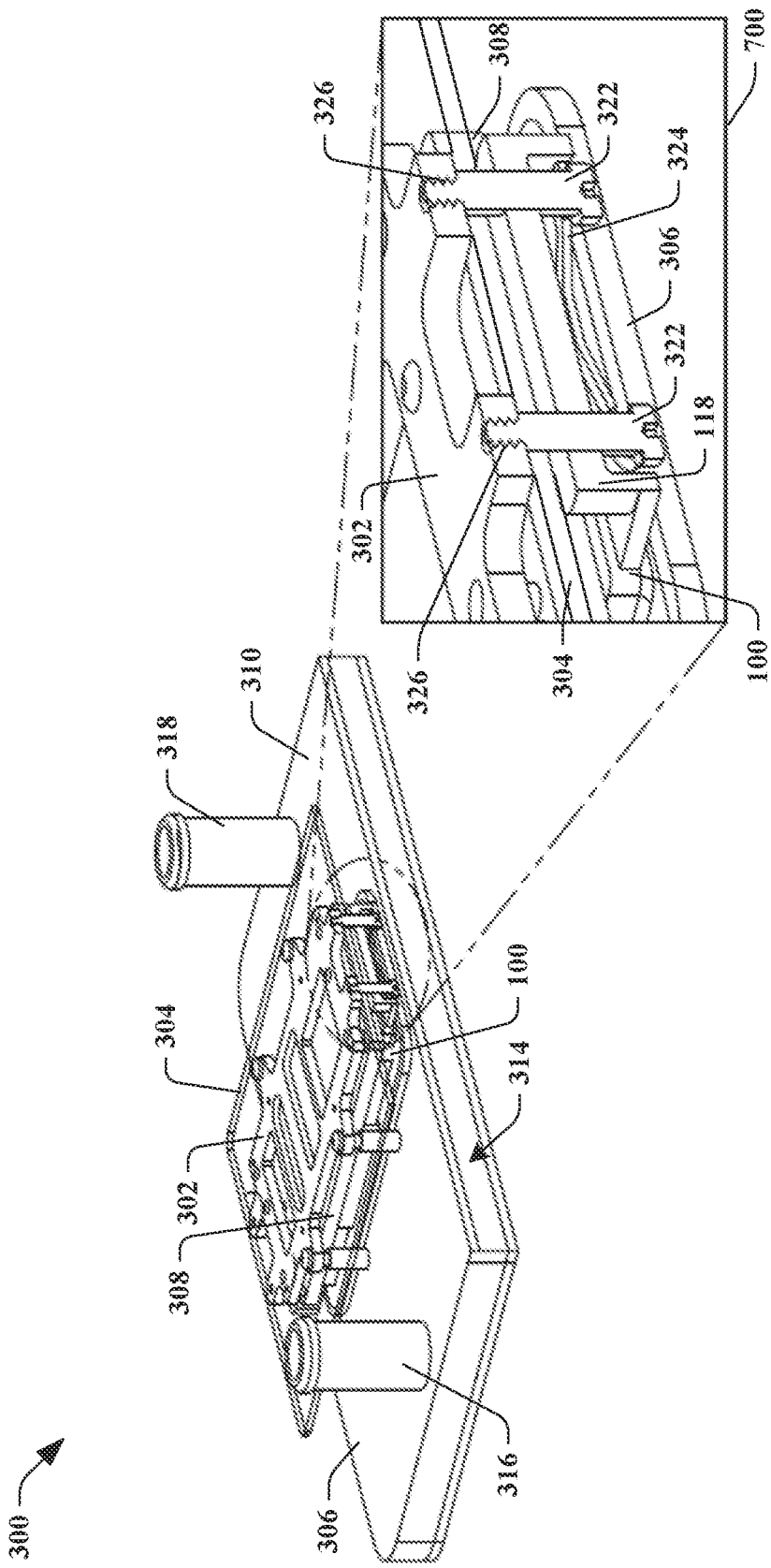
Figure 8:
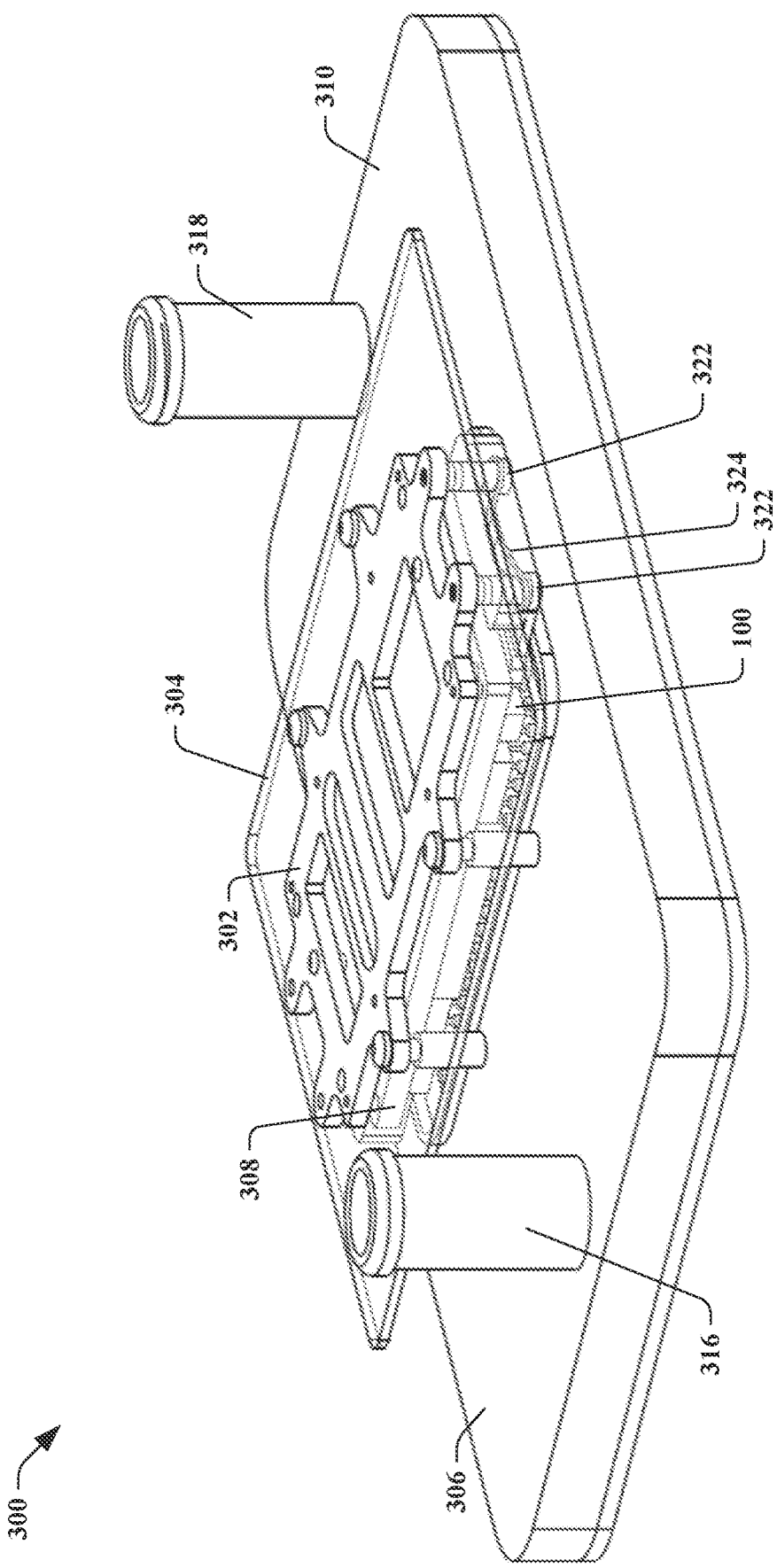

An exemplary autonomous vehicle computing device 300 is illustrated in FIGS. 3-8. FIG. 3 shows a three-dimensional view of the autonomous vehicle computing device 300, where the autonomous vehicle computing device 300 is unassembled. FIG. 4 depicts the autonomous vehicle computing device 300 from the same perspective as illustrated in FIG. 3; the autonomous vehicle computing device 300 is assembled in FIG. 4. FIG. 5 shows a cross sectional view of the autonomous vehicle computing device 300. FIG. 6 depicts a three-dimensional view of the autonomous vehicle computing device 300 with a section removed. FIG. 7 illustrates an exploded view of the autonomous vehicle computing device 300 with a differing section removed (e.g., a printed circuit board assembly 304 is transparent in the view of FIG. 7). FIG. 8 depicts another three-dimensional view of the autonomous vehicle computing device 300 (e.g., the printed circuit board assembly 304 is transparent in the view of FIG. 8). FIGS. 3-8 are described below in combination.

The autonomous vehicle computing device 300 depicted in FIGS. 3-8 includes the heat spreader 100 of FIGS. 1-2. The autonomous vehicle computing device 300 further includes a backplate 302, a printed circuit board assembly 304, and a coldplate 306 (e.g., a heat sink). Moreover, the autonomous vehicle computing device 300 includes a heat generating component 308 (e.g., the printed circuit board assembly 304 can include the heat generating component 308). The heat generating component 308 can be mounted on, integrated into, formed on, etc. the printed circuit board assembly 304 (referred to herein as "a component being on the printed circuit board assembly"). In the examples shown in FIGS. 3-8, the heat generating component 308 is on the printed circuit board assembly 304. Examples of the heat generating component 308 includes a central processing unit (CPU), a graphics processing unit (GPU), a switch, a field-programmable gate array (FPGA), or the like. While one heat generating component 308 is depicted as being included as part of the autonomous vehicle computing device 300, it is to be appreciated that the autonomous vehicle computing device 300 can include substantially any number and/or types of components (e.g., one or more of the other components may be a heat generating component, one or more of the other components may be a differing type of component).

The autonomous vehicle computing device 300 can be configured for use in an autonomous vehicle. Thus, the autonomous vehicle computing device 300 can be attachable to the autonomous vehicle, included in the autonomous vehicle, etc.

The autonomous vehicle computing device 300 can control various functions of the autonomous vehicle. For example, functions that can be controlled by the autonomous vehicle computing device 300 can include driving control (e.g., controlling propulsion, steering, braking, etc.) of the autonomous vehicle, localization of the autonomous vehicle (e.g., determining a local position of the autonomous vehicle), perception of objects nearby the autonomous vehicle (e.g., detecting, classifying, and predicting behavior of the objects nearby the autonomous vehicle), a combination thereof, and so forth. According to an illustration, the autonomous vehicle computing device 300 can be coupled to one or more sensor systems of the autonomous vehicle; thus, the autonomous vehicle computing device 300 can receive sensor signals from the one or more sensor systems. Pursuant to another illustration, a sensor system of the autonomous vehicle can include the autonomous vehicle computing device 300. Following this illustration, the autonomous vehicle computing device 300 can be a sensor in a sensor system of the autonomous vehicle, for instance. Examples of such a sensor include a radar sensor, a lidar sensor, a camera sensor, a hybrid sensor, or the like. A hybrid sensor, for instance, can combine sensing modalities (e.g., a hybrid sensor can be a combination of two or more of a lidar sensor, a camera sensor, and a radar sensor).

In the autonomous vehicle computing device 300, the printed circuit board assembly 304 is between the backplate 302 and the heat spreader 100. Moreover, the heat spreader 100 is between the printed circuit board assembly 304 and the coldplate 306. Further, the heat generating component 308 is between the printed circuit board assembly 304 and the heat spreader 100 (e.g., the heat generating component 308 is on the printed circuit board assembly 304 on the side of the printed circuit board assembly 304 facing the heat spreader 100).

While not shown, it is to be appreciated that the autonomous vehicle computing device 300 can include one or more thermal interface material layers. For instance, a thermal interface material layer can be between the heat generating component 308 and the heat spreader 100. However, in contrast to conventional architectures, the autonomous vehicle computing device 300 lacks a thermal interface material layer between the heat spreader 100 and the coldplate 306.

The coldplate 306 includes a top coldplate surface 310. An opening 312 is defined through the top coldplate surface 310 of the coldplate 306. Moreover, a cavity 314 is defined within the coldplate 306. The opening 312 through the top coldplate surface 310 of the coldplate 306 is contiguous with the cavity 314 within the coldplate 306. Accordingly, the externally integrated fins 114 on the bottom surface 104 of the heat spreader 100 can pass through the opening 312 and be positioned within the cavity 314 in the coldplate 306 (e.g., when the autonomous vehicle computing device 300 is assembled the externally integrated fins 114 are positioned within the cavity 314, the externally integrated fins 114 are inserted into the opening 312 when the autonomous vehicle computing device 300 is being assembled).

When assembled (as shown in FIGS. 4-8), the autonomous vehicle computing device 300 can further include a coolant within the cavity 314 of the coldplate 306. The externally integrated fins 114 on the bottom surface 104 of the heat spreader 100 can be immersed within the coolant in the cavity 314, thus providing convective cooling where heat flows from the externally integrated fins 114 to the coolant. The coldplate 306 can further include an input port 316 and an output port 318. The coolant can flow into the input port 316, through the cavity 314, and out of the output port 318.

As noted above, the channel 116 is defined in the side surface 106 around the heat spreader 100. A mechanical gasket 320 (e.g., an o-ring) can be positioned within the channel 116 (e.g., seated in the channel 116). As shown in FIGS. 5-6, when the autonomous vehicle computing device 300 is assembled, the mechanical gasket 320 is between the side surface 106 of the heat spreader 100 and the top coldplate surface 310 of the coldplate 306 around the opening 312. The mechanical gasket 320 is compressed between the side surface 106 of the heat spreader 100 and the top coldplate surface 310 of the coldplate 306 (e.g., within the opening 312). Accordingly, the mechanical gasket 320 forms a seal between the heat spreader 100 and the coldplate 306; such seal enables the coolant to be retained within the cavity 314 of the coldplate 306. It is contemplated, however, that the claimed subject matter is not limited to forming the seal between the side surface 106 of the heat spreader and the top coldplate surface 310 of the coldplate 306 utilizing the mechanical gasket 320.

In the exemplary autonomous vehicle computing device 300 shown in FIGS. 3-8, the heat spreader 100 is mounted to the backplate 302. Further, the backplate 302 is mounted to the coldplate 306 in the autonomous vehicle computing device 300.

More particularly, the autonomous vehicle computing device 300 can include fasteners 322 and leaf springs 324 to enable the heat spreader 100 to be mounted to the backplate 302. Moreover, fastener receptacles 326 can be formed in the backplate 302 and openings 328 can be defined through the printed circuit board assembly 304. To mount the heat spreader 100 to the backplate 302, one of the leaf springs 324 can be positioned in the pocket 122 of the mounting element 118 and another one of the leaf springs 324 can be positioned in the pocket 124 of the mounting element 120. The fasteners 322 (e.g., screws, bolts, etc.) can be positioned through the leaf springs 324, through the mounting holes 126 and 130 of the mounting elements 118 and 120, and through the openings 328 on the printed circuit board assembly 304. Further, the fasteners 322 can be physically connected to the fastener receptacles 326 of the backplate 302. The exploded view 700 of FIG. 7 shows a cross sectional view of the heat spreader 100 mounted to the backplate 302 as described above. The leaf springs 324 and the fasteners 322 can enable the heat spreader 100 and the backplate 302 to compress the printed circuit board assembly 304 and the heat generating component 308 (as well as any other layer included there between such as a thermal interface material layer (not shown)). The leaf springs 324 can allow for substantially uniform compressive forces to be applied between the heat spreader 100 and the heat generating component 308.

The autonomous vehicle computing device 300 can also include fasteners 330. Moreover, openings 332 can be defined through the backplate 302, openings 334 can be defined through the printed circuit board assembly 304, and the coldplate 306 can include fastener receptacles 336. To mount the backplate 302 to the coldplate 306, the fasteners 330 (e.g., screws, bolts, etc.) can be positioned through the openings 332 of the backplate 302 and through the openings 334 of the printed circuit board assembly 304. Further, the fasteners 330 can be physically connected to the fastener receptacles 336 of the coldplate 306.

Inclusion of the heat spreader 100 with the externally integrated fins 114 in the autonomous vehicle computing device 300 enables various layers of thermal resistance to be removed as compared to conventional architectures, which allows for enhancement of thermal performance. Thermal resistance is a heat property and a measurement of a temperature difference by which an object or material resists heat flow. Conventional designs oftentimes include a thermal interface material layer between a coldplate and a heat spreader, a coldplate pedestal, and coldplate to stack fins (if needed) inside a coolant volume. By having the heat spreader 100 with the externally integrated fins 114, one or more of the foregoing thermal resistance layers can be removed in the autonomous vehicle computing device 300. For instance, the autonomous vehicle computing device 300 lacks a thermal interface material layer between the heat spreader 100 and the coldplate 306; removal of this thermal interface material layer can enhance thermal performance efficiency, reduce material included in the autonomous vehicle computing device 300, and aid re-workability of the autonomous vehicle computing device 300 if teardown is to be performed. Moreover, the autonomous vehicle computing device 300 can lack stack fins brazed into a coldplate. Conventionally, stack fins oftentimes are brazed into the coldplate since the stack fins are separate from traditional heat spreaders, which can add thermal inefficiency (as well as being more complex and/or time consuming to manufacture).

Figure 9:
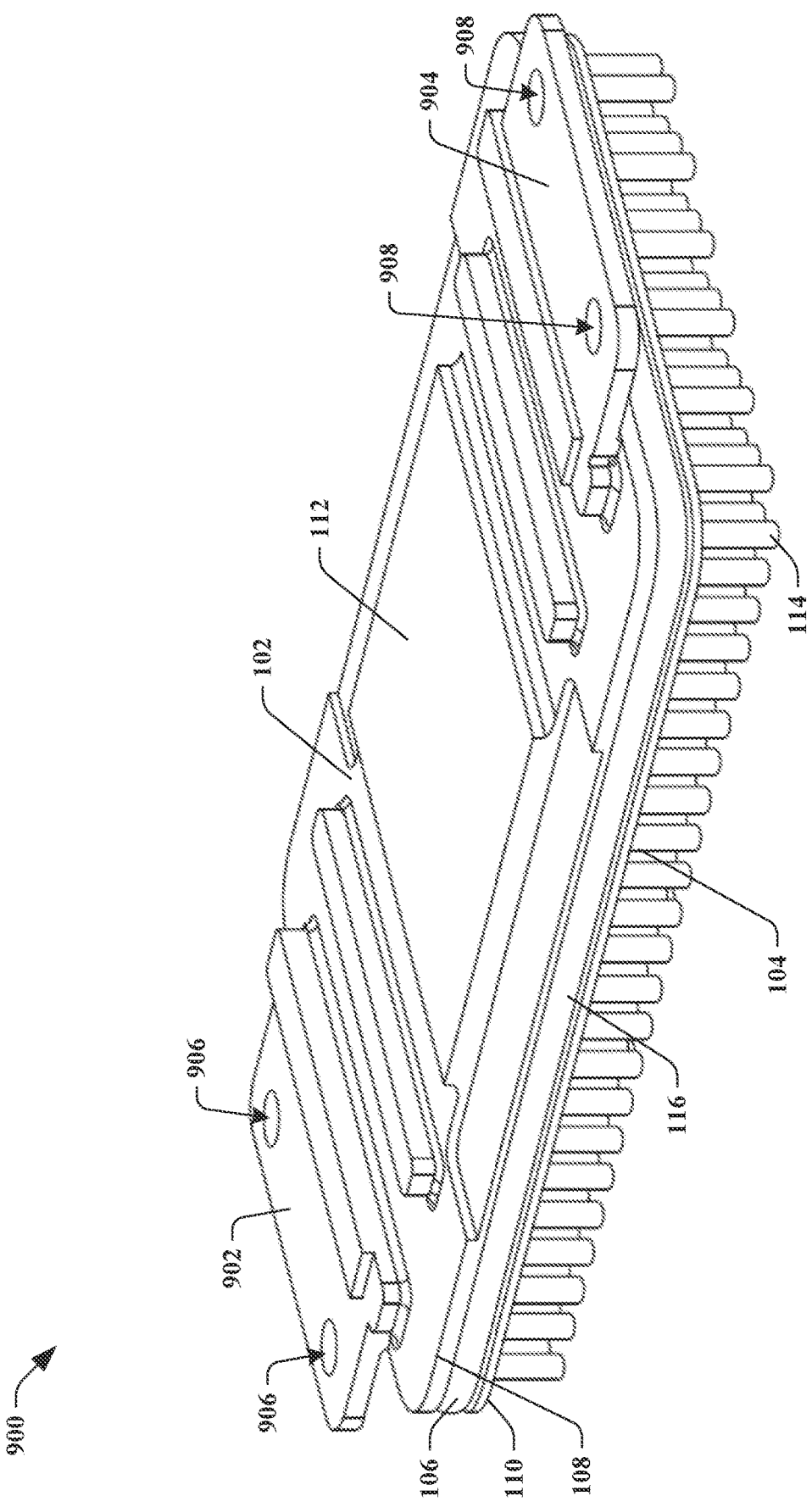
FIGS. 9-10 illustrate another exemplary heat spreader for an autonomous vehicle computing device.
Figure 10:
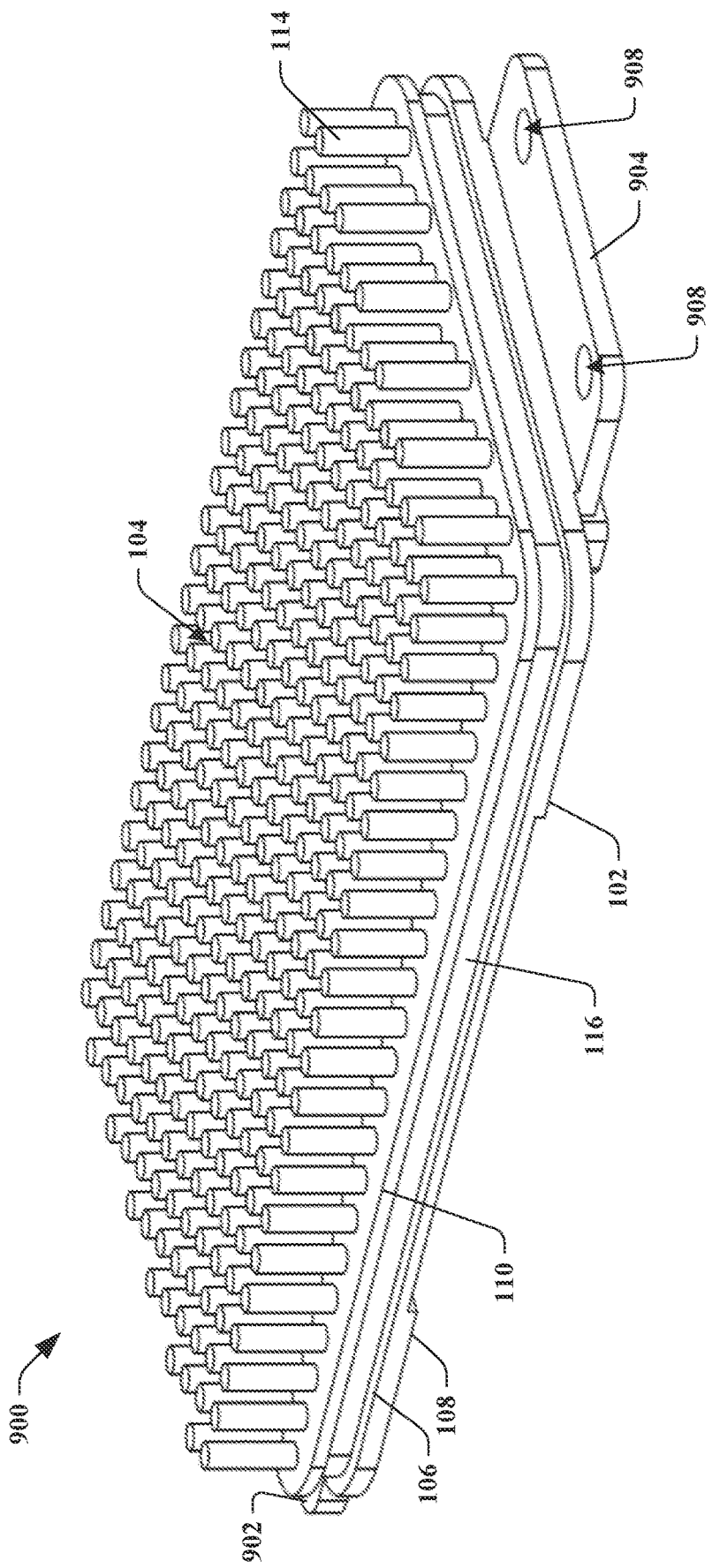

With reference to FIGS. 9-10, illustrated are two views of another exemplary heat spreader 900 for an autonomous vehicle computing device. FIG. 9 depicts a view directed towards a top surface 102 of the heat spreader 900 and FIG. 10 depicts a view directed towards a bottom surface 104 of the heat spreader 900. FIGS. 9-10 are described below in combination. Features of the heat spreader 900 that are substantially similar to features of the heat spreader 100 use the same reference numerals as set forth above.

Similar to above with respect to the heat spreader 100, the heat spreader 900 includes the top surface 102, the bottom surface 104, and the side surface 106. The side surface 106 includes the top edge 108 and the bottom edge 110. The top edge 108 of the side surface 106 is physically coupled to the top surface 102, and the bottom edge 110 of the side surface 106 is physically coupled to the bottom surface 104.

The top surface 102 of the heat spreader 900 is depicted to include the section 112 sized and shaped to align with a heat generating component when included in an autonomous vehicle computing device. Moreover, the bottom surface 104 of the heat spreader 900 includes the externally integrated fins 114. Further, the channel 116 (e.g., configured to receive a mechanical gasket) can be defined in the side surface 106 around the heat spreader 900.

The heat spreader 900 can further include a mounting element 902 and a mounting element 904 (collectively referred to herein as mounting elements 902-904). The mounting elements 902-904 are depicted in the exemplary heat spreader 900 shown in FIGS. 9-10 as being physically coupled to the top surface 102 of the heat spreader 900. However, it is to be appreciated that the mounting elements 902-904 can additionally or alternatively be physically coupled to the side surface 106 and/or the bottom surface 104 of the heat spreader 900. In the embodiment of the heat spreader 900 shown in FIGS. 9-10, the mounting elements 902-904 enable the heat spreader 900 to be mounted to a coldplate in an autonomous vehicle computing device.

In the exemplary heat spreader 900, mounting holes 906 are defined through the mounting element 902, and mounting holes 908 are defined through the mounting element 904. As shown in greater detail herein, fasteners (e.g., screws, bolts, etc.) can pass through the mounting holes 906 and the mounting holes 908 to enable mounting the heat spreader 900 to a coldplate.

Figure 11:
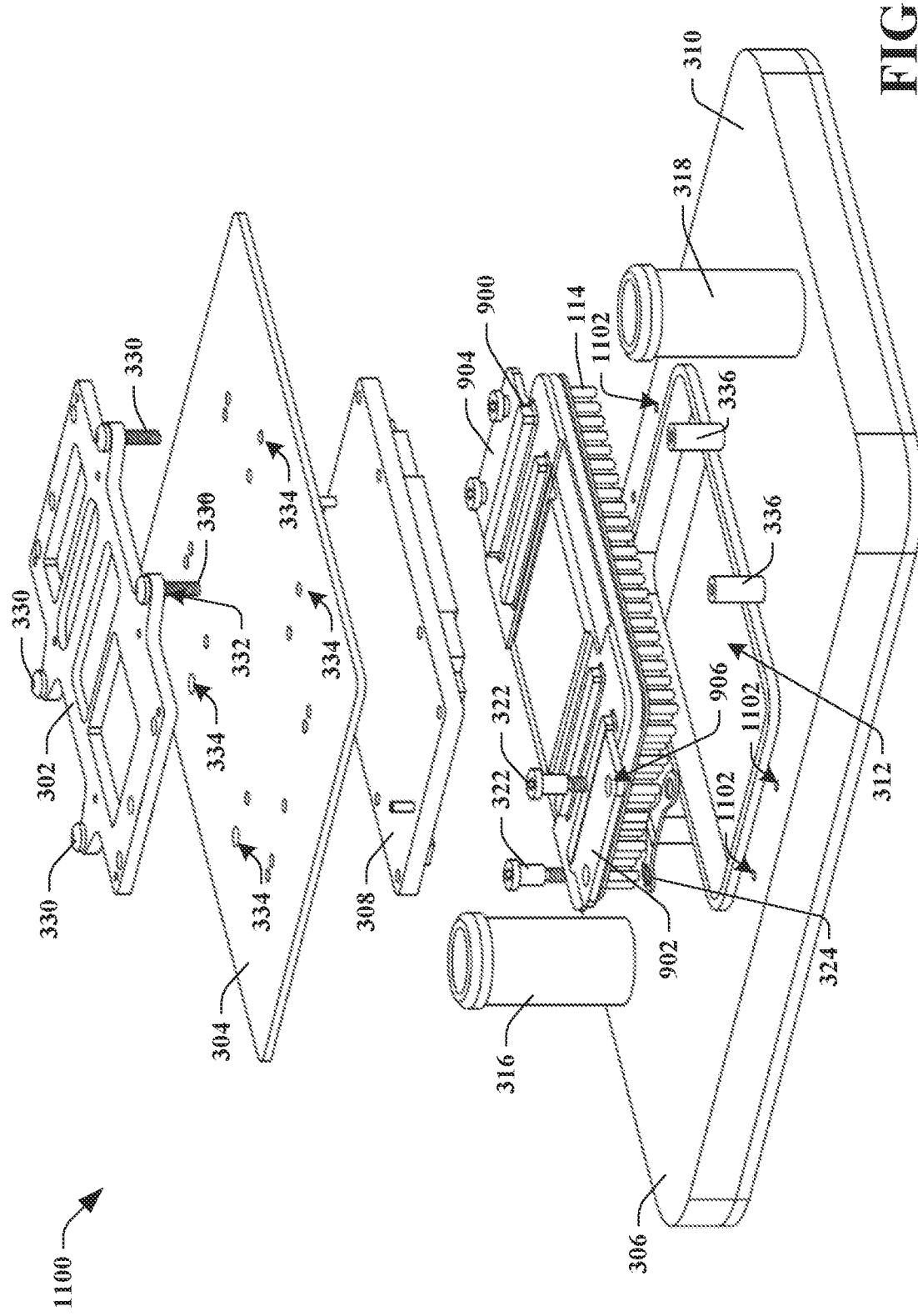
FIGS. 11-16 illustrate an exemplary autonomous vehicle computing device that includes the heat spreader of FIGS. 9-10.
Figure 12:
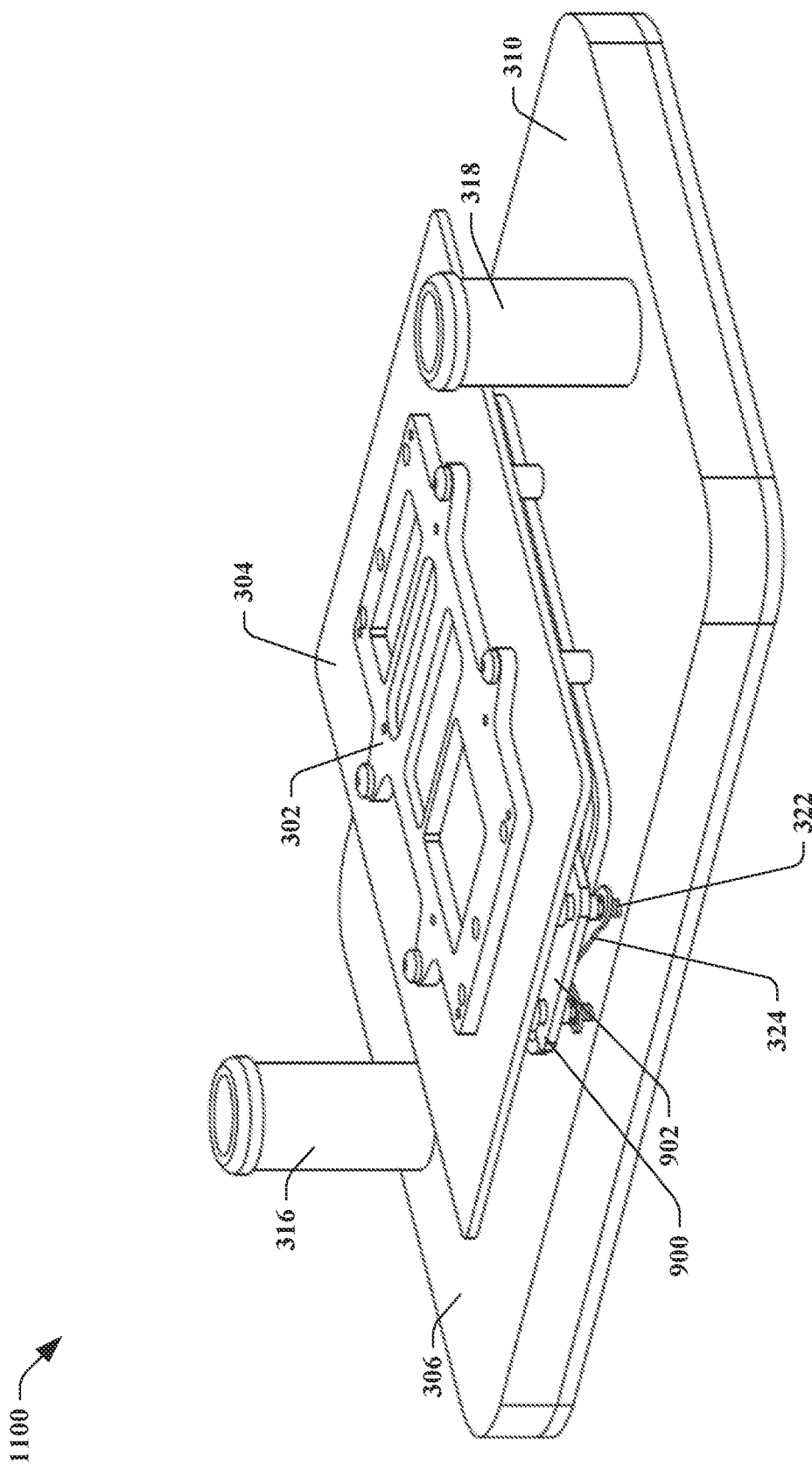
Figure 13:
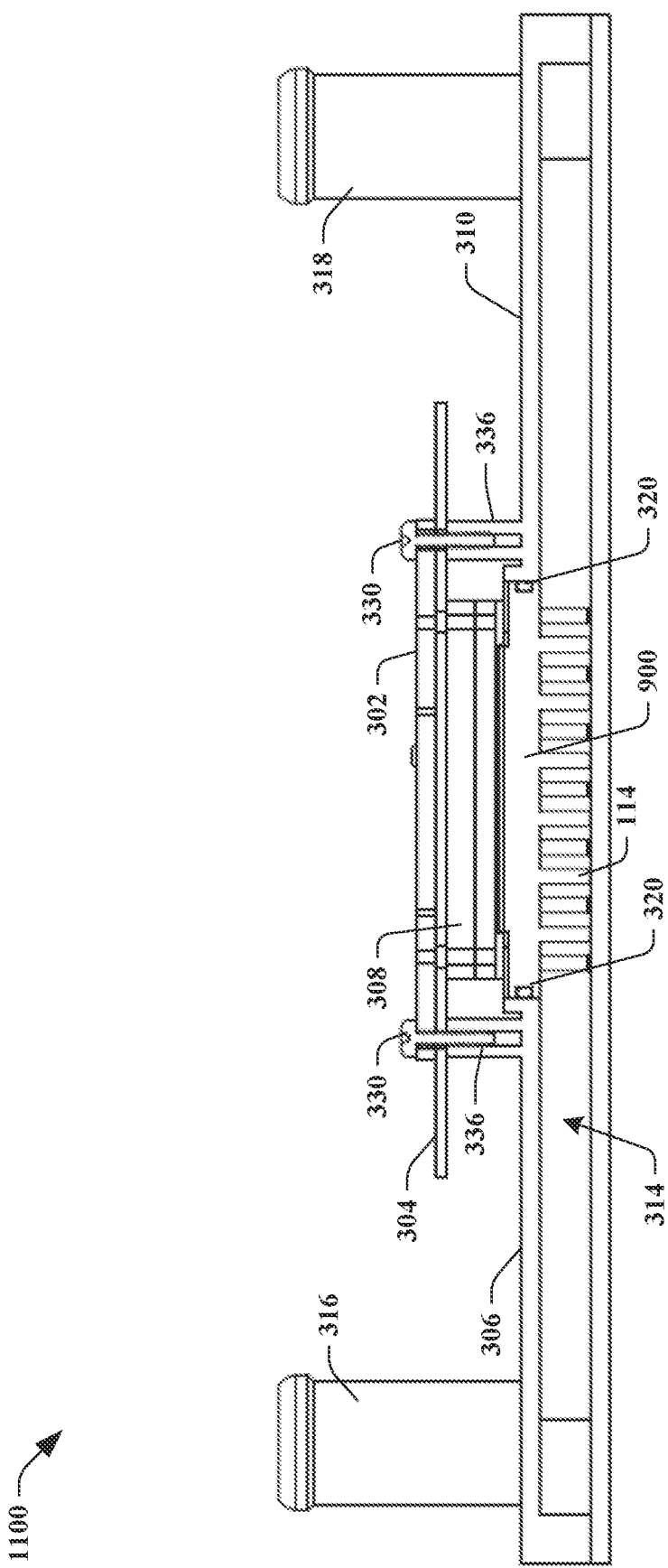
Figure 14:
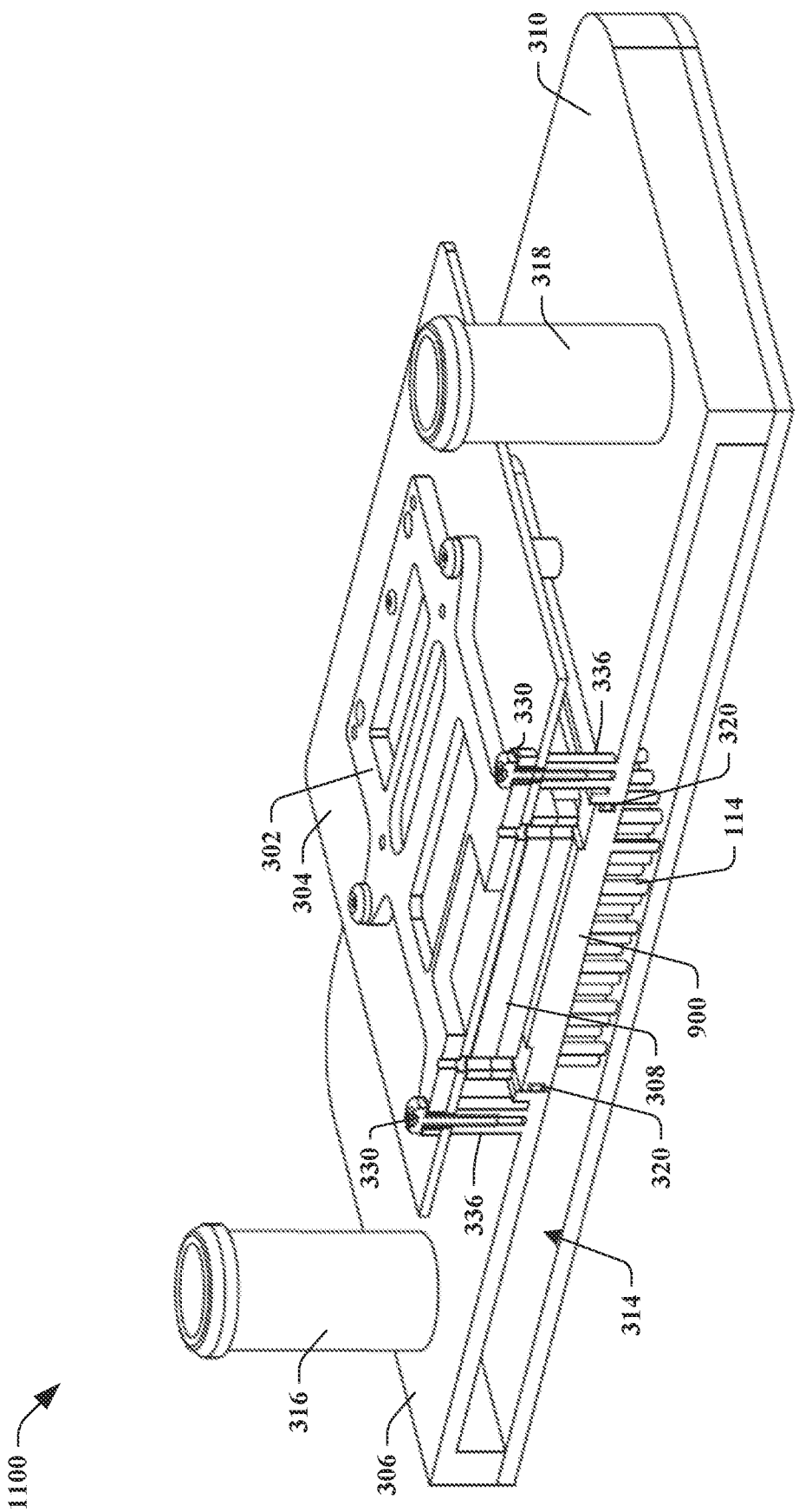
Figure 15:
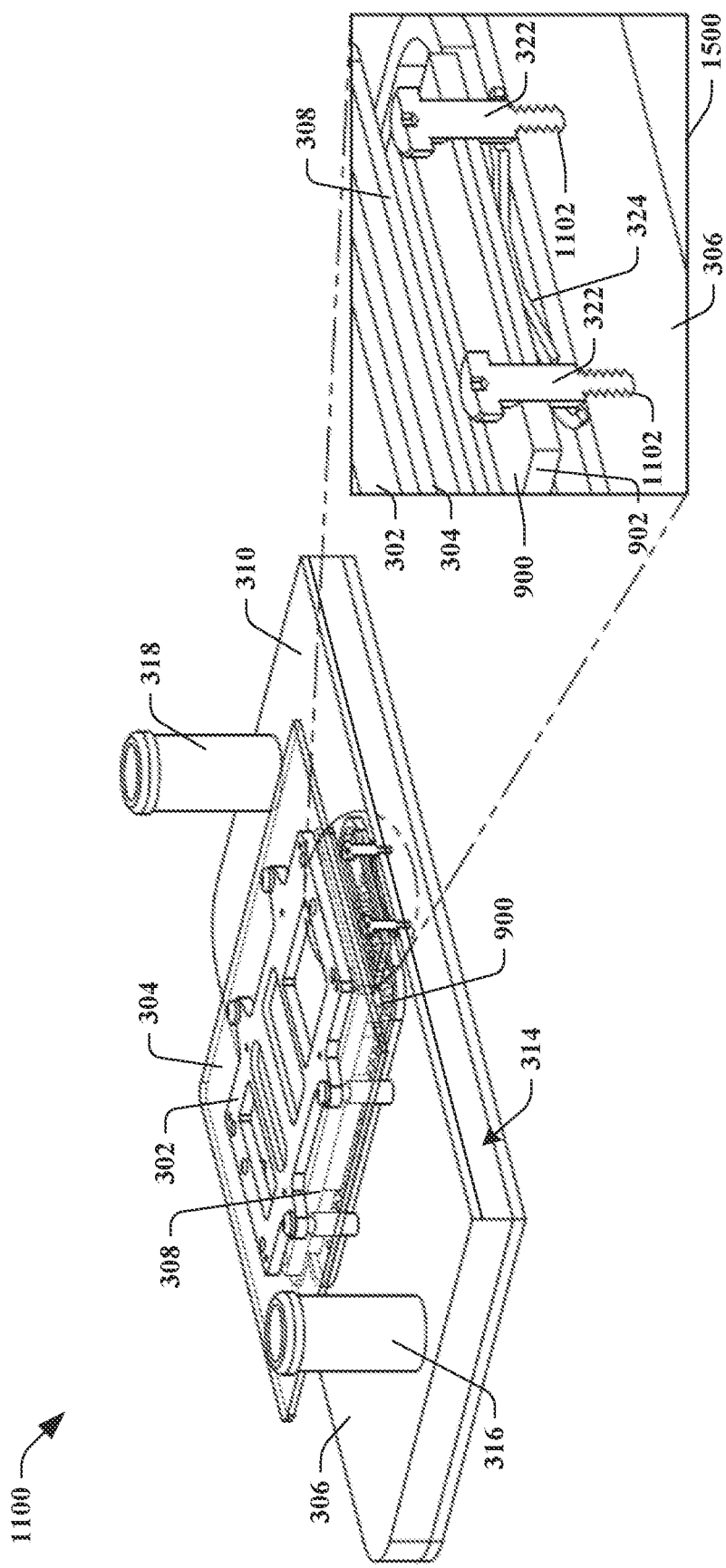
Figure 16:
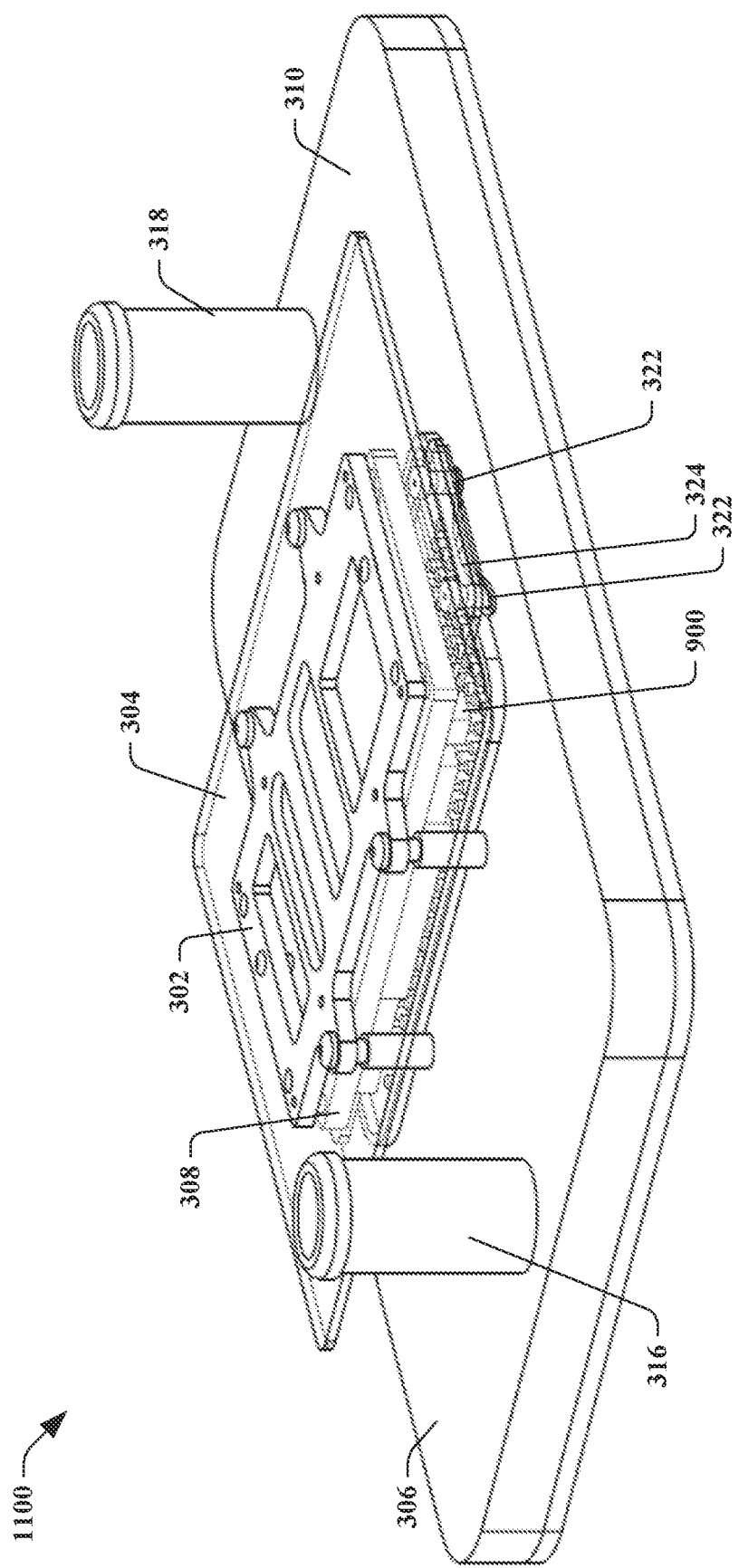

An exemplary autonomous vehicle computing device 1100 is illustrated in FIGS. 11-16. FIG. 11 shows a three-dimensional view of the autonomous vehicle computing device 1100, where the autonomous vehicle computing device 1100 is unassembled. FIG. 12 depicts the autonomous vehicle computing device 1100 from the same perspective as illustrated in FIG. 11; the autonomous vehicle computing device 1100 is assembled in FIG. 12. FIG. 13 shows a cross sectional view of the autonomous vehicle computing device 1100. FIG. 14 depicts a three-dimensional view of the autonomous vehicle computing device 1100 with a section removed. FIG. 15 illustrates an exploded view of the autonomous vehicle computing device 1100 with a differing section removed (e.g., the printed circuit board assembly 304 is transparent in the view of FIG. 15). FIG. 16 depicts another three-dimensional view of the autonomous vehicle computing device 1100 (e.g., the printed circuit board assembly 304 is transparent in the view of FIG. 16). FIGS. 11-16 are described below in combination. Features of the autonomous vehicle computing device 1100 that are substantially similar to features of the autonomous vehicle computing device 300 use the same reference numerals as set forth above.

The autonomous vehicle computing device 1100 of FIGS. 11-16 includes the heat spreader 900 of FIGS. 9-10. The autonomous vehicle computing device 1100 further includes the backplate 302, the printed circuit board assembly 304, and the coldplate 306. The autonomous vehicle computing device 1100 also includes the heat generating component 308 (e.g., the printed circuit board assembly 304 includes the heat generating component 308, the heat generating component 308 is on the printed circuit board assembly 304).

Similar to above with respect to the autonomous vehicle computing device 300, the printed circuit board assembly 304 is between the backplate 302 and the heat spreader 900 in the autonomous vehicle computing device 1100. Moreover, the heat spreader 900 is between the printed circuit board assembly 304 and the coldplate 306. Further, the heat generating component 308 is between the printed circuit board assembly 304 and the heat spreader 900 (e.g., the heat generating component 308 is on the printed circuit board assembly 304 on the side of the printed circuit board assembly 304 facing the heat spreader 900).

The coldplate 306 again includes the top coldplate surface 310, where an opening 312 is defined through the top coldplate surface 310. Further, the cavity 314 is defined within the coldplate 306. When assembled (as shown in FIGS. 12-16), the autonomous vehicle computing device 1100 can further include a coolant within the cavity of the coldplate 306. The externally integrated fins 114 on the bottom surface 104 of the heat spreader 900 can be immersed within the coolant in the cavity 314, thus providing convective cooling where heat flows from the externally integrated fins 114 to the coolant. The coldplate 306 can further include the input port 316 and the output port 318, where the coolant can flow into the input port 316, through the cavity 314, and out of the output port 318.

Moreover, the mechanical gasket 320 can be positioned in the channel 116 defined in the side surface 106 around the heat spreader 900. The mechanical gasket 320 can be compressed between the side surface 106 of the heat spreader 900 and the top coldplate surface 310 of the coldplate 306 (e.g., within the opening 312).

In the exemplary autonomous vehicle computing device 1100 shown in FIGS. 11-16, the heat spreader 900 is mounted to the coldplate 306. Moreover, the backplate 302 is mounted to the coldplate 306 in the autonomous vehicle computing device 1100.

The autonomous vehicle computing device 1100 can include the fasteners 322 and the leaf springs 324 to enable the heat spreader 900 to be mounted to the coldplate 306. Moreover, fastener receptacles 1102 can be formed in the coldplate 306. To mount the heat spreader 900 to the coldplate 306, the fasteners 322 can be positioned through the mounting holes 906-908 of the mounting elements 902-904 and through the leaf springs 324. The fasteners 324 can further be physically connected to the fastener receptacles 1102 of the coldplate 306. The exploded view 1500 of FIG. 15 shows a cross sectional view of the heat spreader 900 mounted to the coldplate 306 as described above.

Moreover, similar to the autonomous vehicle computing device 300, the backplate 302 can be mounted to the coldplate 306 by positioning the fasteners 330 through the openings 332 of the backplate 302 and through the opening 334 of the printed circuit board assembly 304. Further, the fasteners 330 can be physically connected to the fastener receptacles 336 of the coldplate 306.

Reference is now generally made to the heat spreader 100 and the heat spreader 900. As noted herein, a housing of a heat spreader (the heat spreader 100 or the heat spreader 900) can be defined by the top surface 102, the bottom surface 104, and the side surface 106.

Figure 17:
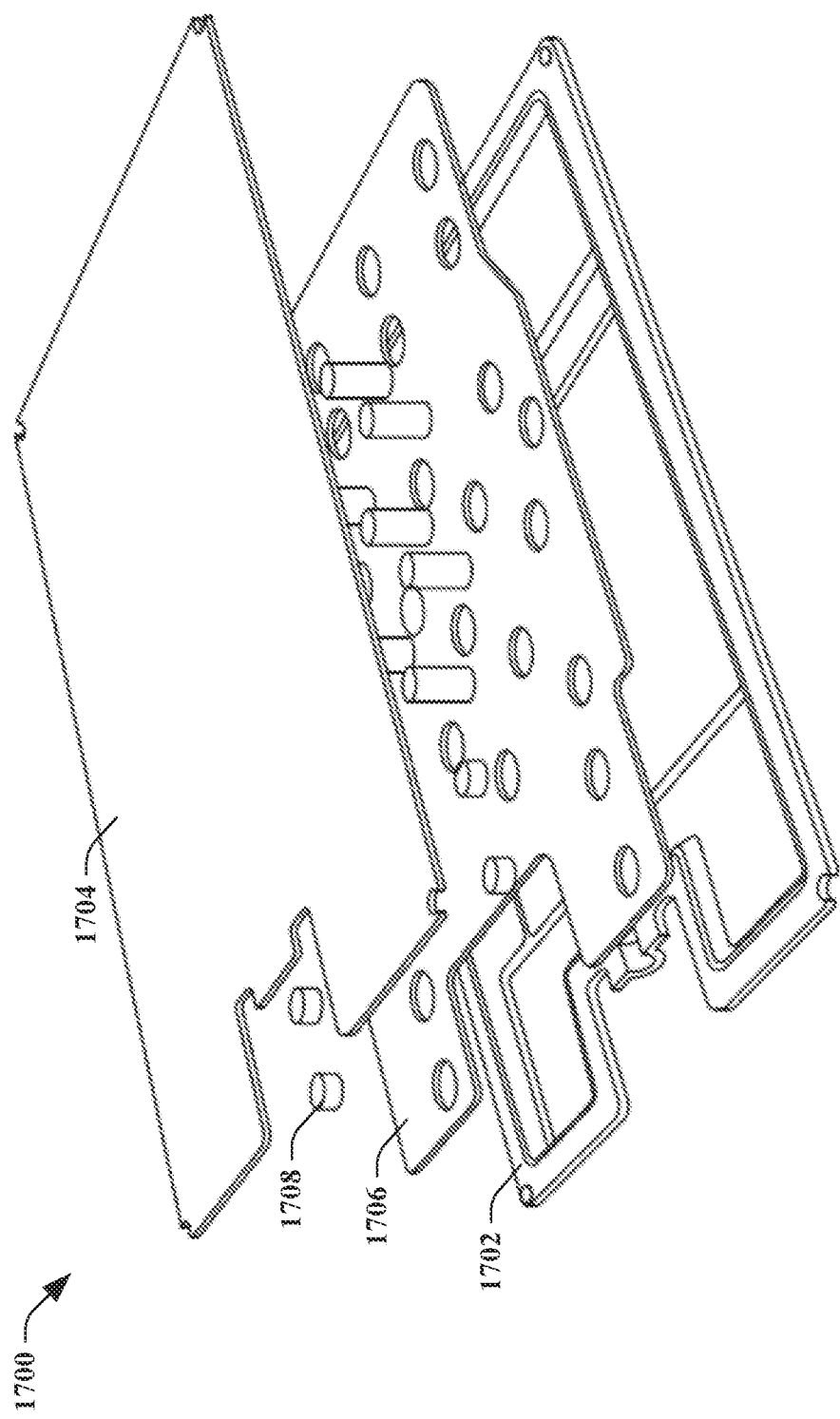
FIG. 17 illustrates an exemplary vapor chamber that can be included in a heat spreader.

According to various embodiments, the housing of the heat spreader 100 or the heat spreader 900 can include a vapor chamber. FIG. 17 depicts an exemplary vapor chamber 1700 that can be included in the housing of the heat spreader defined by the top surface 102, the bottom surface 104, and the side surface 106. The vapor chamber 1700 can include a first cover 1702, a second cover 1704, a capillary structure 1706, and pillars 1708. When assembled, the capillary structure 1706 can be between the first cover 1702 and the second cover 1704. According to an example, the top surface 102 of the heat spreader can be or include the first cover 1702, and the bottom surface 104 of the head spreader can be or include the second cover 1704; however, the claimed subject matter is not so limited (e.g., the top surface 102, the bottom surface 104, and the side surface 106 can define a cavity and the vapor chamber 1700 can be within such cavity).

Figure 18:
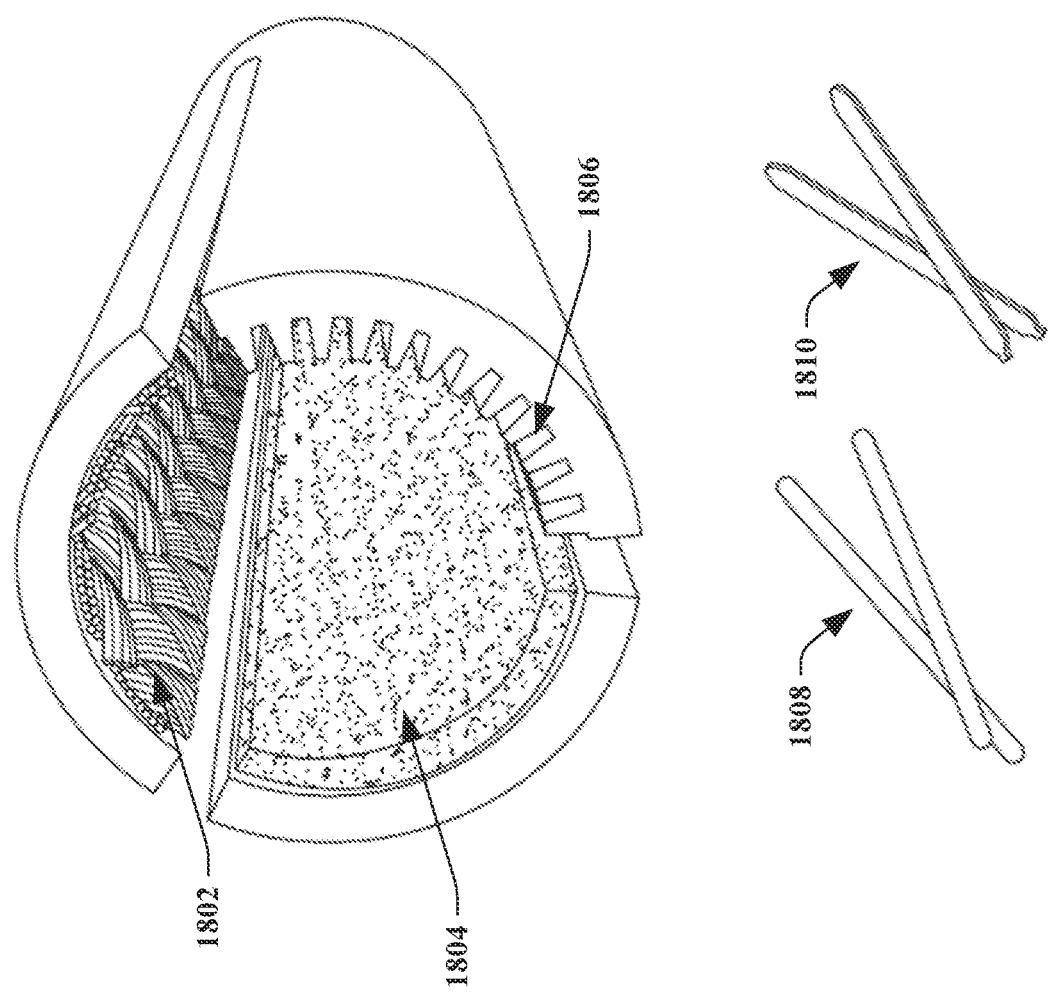
FIG. 18 illustrates exemplary features of a heat pipe that can be included in a heat spreader.

Pursuant to other embodiments, the housing of the heat spreader 100 or the heat spreader 900 can include one or more heat pipes. The heat pipes can at least partially be within the housing defined by the top surface 102, the bottom surface 104, and the side surface 106. FIG. 18 illustrates exemplary features of heat pipes that can be included in the heat spreader. For instance, an inside structure of a heat pipe can include a mesh 1802, a powder 1804, or a wire or grooved structure 1806. Moreover, the heat pipes included in the heat spreader can be round heat pipes 1808 or flat heat pipes 1810.

In accordance with another embodiment, it is contemplated that the housing of the heat spreader 100 or the heat spreader 900 can be solid. Accordingly, the heat spreader can lack heat pipes, a vapor chamber, or other type of cavity within the housing defined by the top surface 102, the bottom surface 104, and the side surface 106.

Figure 19:
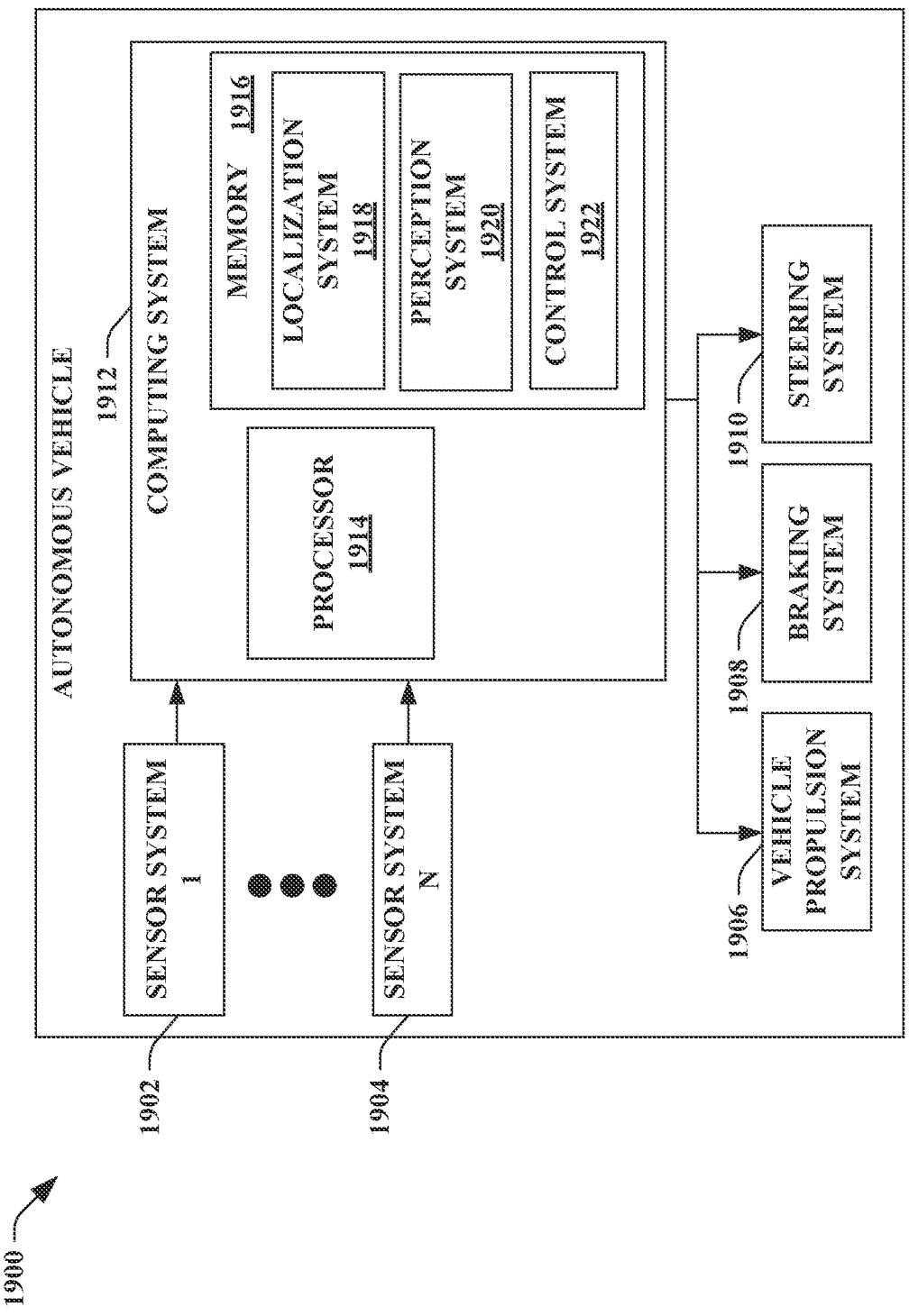
FIG. 19 illustrates a functional block diagram of an exemplary autonomous vehicle.

Turning to FIG. 19, illustrates an autonomous vehicle 1900. The autonomous vehicle 1900 can navigate about roadways without human conduction based upon sensor signals outputted by sensor systems of the autonomous vehicle 1900. The autonomous vehicle 1900 includes a plurality of sensor systems, namely, a sensor system 1 1902, . . . , and a sensor system N 1904, where N can be substantially any integer greater than 1 (collectively referred to herein as sensor systems 1902-1904). The sensor systems 1902-1904 are of different types and are arranged about the autonomous vehicle 1900. For example, the sensor system 1 1902 may be a lidar sensor system and the sensor system N 1904 may be a camera (image) system. Other exemplary sensor systems included in the sensor systems 1902-1904 can include radar sensor systems, GPS sensor systems, sonar sensor systems, infrared sensor systems, and the like.

The autonomous vehicle 1900 further includes several mechanical systems that are used to effectuate appropriate motion of the autonomous vehicle 1900. For instance, the mechanical systems can include, but are not limited to, a vehicle propulsion system 1906, a braking system 1908, and a steering system 1910. The vehicle propulsion system 1906 may be an electric engine or a combustion engine. The braking system 1908 can include an engine brake, brake pads, actuators, and/or any other suitable componentry that is configured to assist in decelerating the autonomous vehicle 1900. The steering system 1910 includes suitable componentry that is configured to control the direction of movement of the autonomous vehicle 1900.

The autonomous vehicle 1900 additionally includes a computing system 1914 that is in communication with the sensor systems 1902-1904, the vehicle propulsion system 1906, the braking system 1908, and the steering system 1910. The computing system 1912 includes a processor 1914 and memory 1916; the memory 1916 includes computer-executable instructions that are executed by the processor 1914. Pursuant to various examples, the processor 1914 can be or include a graphics processing unit (GPU), a plurality of GPUs, a central processing unit (CPU), a plurality of CPUs, an application-specific integrated circuit (ASIC), a microcontroller, a programmable logic controller (PLC), a field programmable gate array (FPGA), or the like.

The memory 1916 of the computing system 1912 can include a localization system 1918, a perception system 1920, and a control system 1922. The localization system 1918 can be configured to determine a local position of the autonomous vehicle 1900. The perception system 1920 can be configured to perceive objects nearby the autonomous vehicle 1900 (e.g., based on outputs from the sensor systems 1902-1904). For instance, the perception system 1920 can detect, classify, and predict behaviors of objects nearby the autonomous vehicle 1900. Moreover, the control system 1922 can be configured to control at least one of the mechanical systems of the autonomous vehicle 1900 (e.g., at least one of the vehicle propulsion system 1906, the braking system 1908, and/or the steering system 1910).

According to various examples, the computing system 1912 can be or include an autonomous vehicle computing device (e.g., the autonomous vehicle computing device 300 or 1100). Pursuant to other examples, a sensor system (e.g., the sensor system 1 1902, . . . , or the sensor system N 1904) can include an autonomous vehicle computing device (e.g., the autonomous vehicle computing device 300 or 1100).

Figure 20:
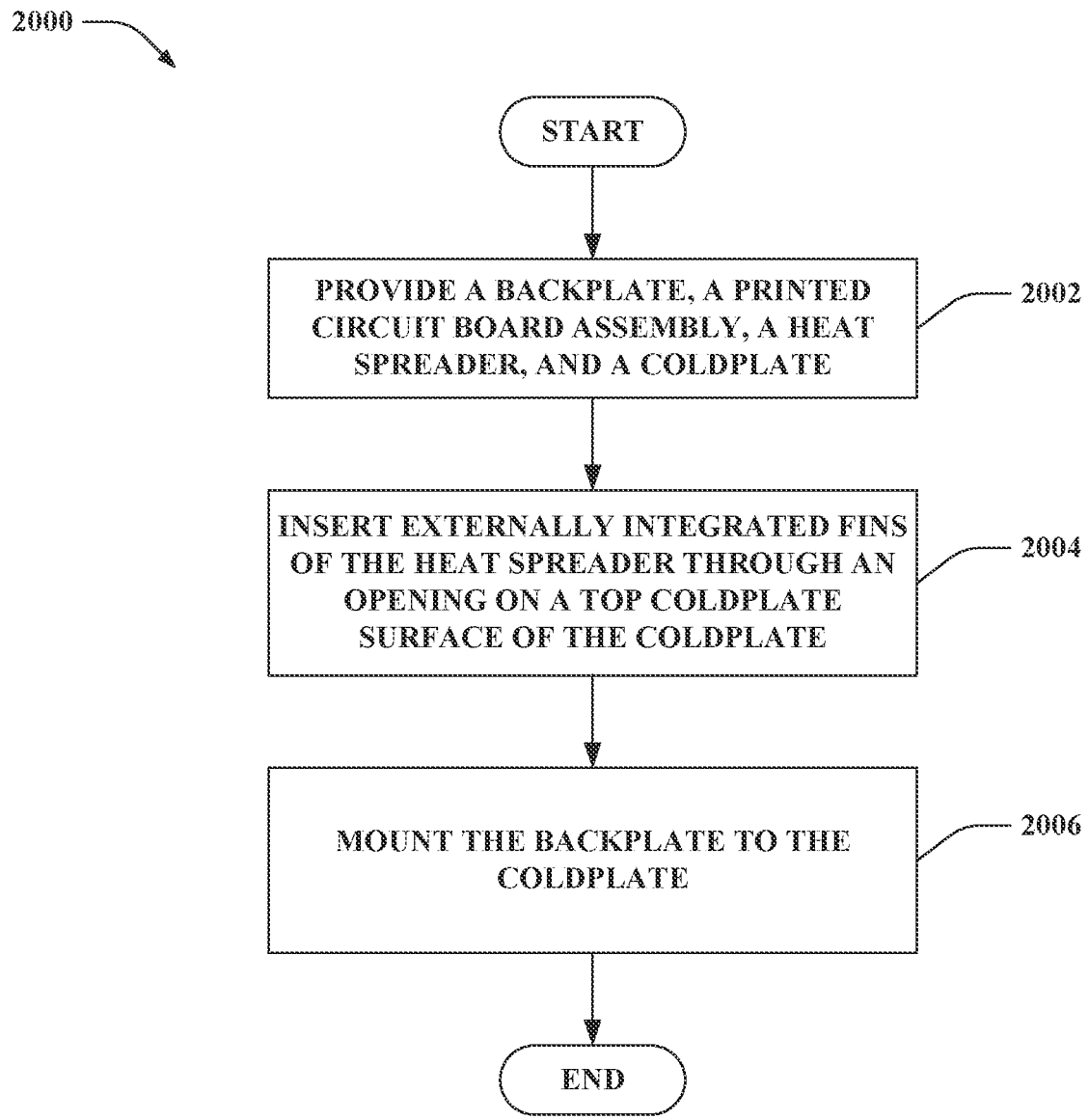
FIG. 20 is a flow diagram that illustrates an exemplary methodology of assembling an autonomous vehicle computing device.

FIG. 20 illustrates an exemplary methodology relating to assembling an autonomous vehicle computing device. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

FIG. 20 illustrates a methodology 2000 of assembling an autonomous vehicle computing device. At 2002, a backplate, a printed circuit board assembly, a heat spreader, and a coldplate can be provided. The printed circuit board assembly includes a heat generating component. Moreover, the heat spreader includes externally integrated fins. The heat spreader is configured to receive heat from the heat generating component. Moreover, the coldplate has a cavity defined therein, where an opening defined through a top coldplate surface of the coldplate is contiguous with the cavity. At 2004, the externally integrated fins of the heat spreader can be inserted through the opening on the top coldplate surface of the coldplate such that the externally integrated fins are positioned within the cavity defined within the coldplate. At 2006, the backplate is mounted to the coldplate such that the printed circuit board assembly is between the backplate and the heat spreader, and the heat spreader is between the printed circuit board assembly and the coldplate. According to various embodiments, the heat spreader can be mounted to the coldplate. Pursuant to other embodiments, the heat spreader can be mounted to the backplate.

Figure 21:
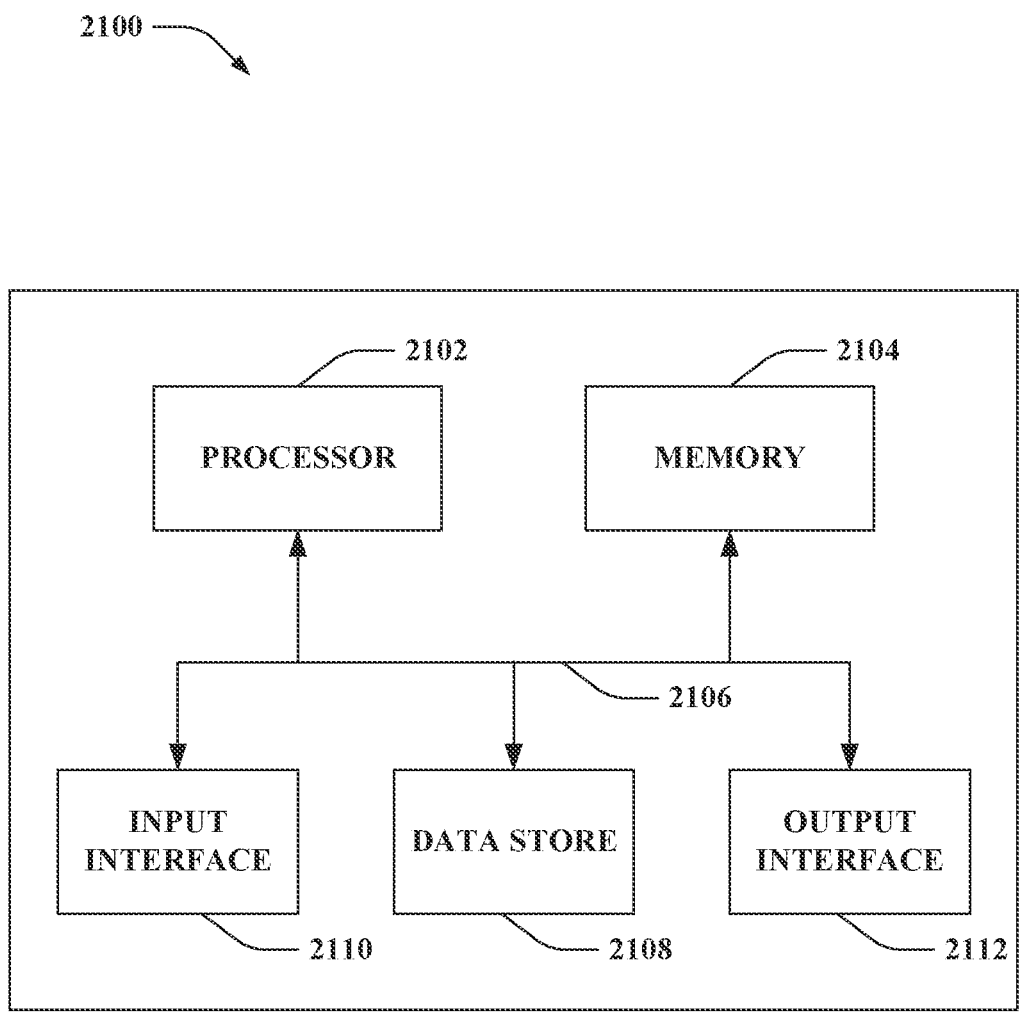
FIG. 21 illustrates an exemplary computing device.

Referring now to FIG. 21, a high-level illustration of an exemplary computing device 2100 that can be used in accordance with the systems and methodologies disclosed herein is illustrated. For instance, the computing device 2100 may be or include the computing system 1912. The computing device 2100 includes at least one processor 2102 that executes instructions that are stored in a memory 2104. The instructions may be, for instance, instructions for implementing functionality described as being carried out by one or more systems discussed above or instructions for implementing one or more of the methods described above. The processor 2102 may be a GPU, a plurality of GPUs, a CPU, a plurality of CPUs, a multi-core processor, etc. The processor 2102 may access the memory 2104 by way of a system bus 2106.

The computing device 2100 additionally includes a data store 2108 that is accessible by the processor 2102 by way of the system bus 2106. The data store 2108 may include executable instructions, various data, etc. The computing device 2100 also includes an input interface 2110 that allows external devices to communicate with the computing device 2100. For instance, the input interface 2110 may be used to receive instructions from an external computer device, etc. The computing device 2100 also includes an output interface 2112 that interfaces the computing device 2100 with one or more external devices. For example, the computing device 2100 may transmit control signals to the vehicle propulsion system 1906, the braking system 1908, and/or the steering system 1910 by way of the output interface 2112.

Additionally, while illustrated as a single system, it is to be understood that the computing device 2100 may be a distributed system. Thus, for instance, several devices may be in communication by way of a network connection and may collectively perform tasks described as being performed by the computing device 2100.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A heat spreader, comprising:
a top surface, the top surface being thermally conductive such that the top surface is configured to receive heat from a heat generating component;
a bottom surface, the bottom surface comprises externally integrated fins;
a side surface, the side surface comprises a top edge and a bottom edge, the top edge of the side surface being physically coupled to the top surface and the bottom edge of the side surface being physically coupled to the bottom surface; and
a mounting element comprising a first portion and a second portion, wherein the first portion is physically coupled to at least one of the top surface, the bottom surface, or the side surface such that the first portion of the mounting element is contiguous with the at least one of the top surface, the bottom surface, or the side surface to which the first portion of the mounting element is physically coupled, wherein the second portion of the mounting element comprises a first side, a second side, and a pocket, wherein an opening is defined on the first side of the mounting element into the pocket, and wherein mounting holes are defined through the second side into the pocket;
wherein the heat spreader is configured to dissipate the heat from the heat generating component such that the heat flows from the top surface to the externally integrated fins on the bottom surface.

2. The heat spreader of claim 1, wherein a channel is defined in the side surface around the heat spreader, the channel being configured to receive a mechanical gasket.

3. The heat spreader of claim 1, further comprising:
heat pipes, wherein the heat pipes are at least partially within a housing of the heat spreader defined by the top surface, the bottom surface, and the side surface.

4. The heat spreader of claim 1, further comprising:
a vapor chamber within a housing of the heat spreader defined by the top surface, the bottom surface, and the side surface.

5. The heat spreader of claim 1 being formed at least partially of pyrolytic graphite.

6. The heat spreader of claim 1 being formed at least partially of copper or aluminum.

7. The heat spreader of claim 1 being configured to mount to a coldplate.

8. The heat spreader of claim 1 being configured to mount to a backplate, wherein the backplate is configured to mount to a coldplate.

9. The heat spreader of claim 1, wherein the pocket of the mounting element is configured to receive a leaf spring.

10. An autonomous vehicle computing device, comprising:
a backplate;
a printed circuit board assembly, the printed circuit board assembly comprises a heat generating component;
a heat spreader, the heat spreader comprises:
a top surface, the top surface being thermally conductive such that the top surface is configured to receive heat from the heat generating component;
a bottom surface, the bottom surface comprises externally integrated fins;
a side surface, the side surface comprises a top edge and a bottom edge, the top edge of the side surface being physically coupled to the top surface and the bottom edge of the side surface being physically coupled to the bottom surface; and
a mounting element comprising a first portion and a second portion, wherein the first portion is physically coupled to at least one of the top surface, the bottom surface, or the side surface such that the first portion of the mounting element is contiguous with the at least one of the top surface, the bottom surface, or the side surface to which the first portion of the mounting element is physically coupled, wherein the second portion of the mounting element comprises a first side, a second side, and a pocket, wherein a pocket opening is defined on the first side of the mounting element into the pocket, wherein mounting holes are defined through the second side into the pocket, and wherein a leaf spring is in the pocket; and
a coldplate having a cavity defined therein, the coldplate comprises a top coldplate surface, wherein an opening is defined through the top coldplate surface of the coldplate to the cavity;
wherein the printed circuit board assembly is between the backplate and the heat spreader, and wherein the heat spreader is between the printed circuit board assembly and the coldplate; and
wherein the externally integrated fins on the bottom surface of the heat spreader are positioned within the cavity in the coldplate.

11. The autonomous vehicle computing device of claim 10, wherein a channel is defined in the side surface around the heat spreader, wherein a mechanical gasket is positioned within the channel, and wherein the mechanical gasket is between the side surface of the heat spreader and the top coldplate surface of the coldplate around the opening.

12. The autonomous vehicle computing device of claim 10, the heat generating component being one of a central processing unit (CPU), a graphics processing unit (GPU), a switch, or a field-programmable gate array (FPGA).

13. The autonomous vehicle computing device of claim 10, further comprising:
a coolant within the cavity of the coldplate, wherein the externally integrated fins are immersed within the coolant.

14. The autonomous vehicle computing device of claim 13, the coldplate further comprises an input port and an output port, wherein the coolant flows into the input port, through the cavity of the coldplate, and out of the output port.

15. The autonomous vehicle computing device of claim 10, wherein the heat spreader is mounted on the coldplate.

16. The autonomous vehicle computing device of claim 10, wherein the heat spreader is mounted on the backplate.

17. The autonomous vehicle computing device of claim 16, further comprising fasteners, wherein the fasteners:
pass through the leaf spring in the pocket of the mounting element of the heat spreader;
pass through the mounting holes defined through the second side of the mounting element;
pass through openings on the printed circuit board assembly; and
connect to fastener receptacles of the backplate.

18. The autonomous vehicle computing device of claim 10, the heat spreader further comprising:
heat pipes, wherein the heat pipes are at least partially within a housing of the heat spreader defined by the top surface, the bottom surface, and the side surface.

19. The autonomous vehicle computing device of claim 10, the heat spreader further comprising:
a vapor chamber within a housing of the heat spreader defined by the top surface, the bottom surface, and the side surface.

20. A method of assembling an autonomous vehicle computing device, comprising:
providing a backplate, a printed circuit board assembly, a heat spreader, and a coldplate, wherein:
the printed circuit board assembly includes a heat generating component;
the heat spreader includes externally integrated fins, the heat spreader being configured to receive heat from the heat generating component; and
the coldplate has a cavity defined therein, where an opening defined through a top coldplate surface of the coldplate is contiguous with the cavity;
mounting the heat spreader on the backplate such that fasteners:
pass through a leaf spring positioned in a pocket of a mounting element of the heat spreader;
pass through mounting holes defined through the mounting element of the heat spreader;
pass through openings on the printed circuit board assembly; and
connect to fastener receptacles of the backplate;
inserting the externally integrated fins of the heat spreader through the opening on the top coldplate surface of the coldplate such that the externally integrated fins are positioned within the cavity defined within the coldplate; and mounting the backplate to the coldplate such that the printed circuit board assembly is between the backplate and the heat spreader, and the heat spreader is between the printed circuit board assembly and the coldplate.

\* \* \* \* \*